United States Patent
Park et al.

(10) Patent No.: US 12,113,567 B2
(45) Date of Patent: Oct. 8, 2024

(54) WIRELESS SIGNAL DIGITAL CONVERSION DEVICE

(71) Applicant: LG Electronics Inc., Seoul (KR)

(72) Inventors: Sungho Park, Seoul (KR); Kwansoo Kim, Seoul (KR); Sunam Kim, Seoul (KR); Jeongin Kim, Seoul (KR); Jaehwan Kim, Seoul (KR); Sungryong Hong, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 18/024,668

(22) PCT Filed: Sep. 3, 2020

(86) PCT No.: PCT/KR2020/011858
§ 371 (c)(1),
(2) Date: Mar. 3, 2023

(87) PCT Pub. No.: WO2022/050441
PCT Pub. Date: Mar. 10, 2022

(65) Prior Publication Data
US 2023/0246666 A1    Aug. 3, 2023

(51) Int. Cl.
*H04B 1/40* (2015.01)
*H03M 7/16* (2006.01)
(52) U.S. Cl.
CPC ............... *H04B 1/40* (2013.01); *H03M 7/16* (2013.01)

(58) Field of Classification Search
CPC ........ H04B 1/40; H04B 7/07413; H04B 7/02; H04B 7/04; H04B 7/0404; H04B 7/0413;
(Continued)

(56) References Cited

U.S. PATENT DOCUMENTS 7,317,935 B2 * 1/2008 Tsai ..................... H04B 7/0842
                                                    455/562.1
8,217,822 B2 * 7/2012 Lovitt ................... H03M 1/188
                                                    341/139

(Continued)

FOREIGN PATENT DOCUMENTS

JP    2011199780    10/2011
KR    19980027730    7/1998
(Continued)

*Primary Examiner* — Sophia Vlahos
(74) *Attorney, Agent, or Firm* — Fish & Richardson P.C.

(57) ABSTRACT

A wireless signal digital conversion device includes: a plurality of RF signal processing units for receiving wireless signals, and adjusting the voltage levels of the wireless signals based on automatic gain values; a plurality of unit ADCs for receiving in-phase signals and quadrature phase signals of the RF signal processing units, and performing analog-to-digital conversion based on different differential reference voltages; an encoder unit for generating binary data having less bits than binary data outputted from the unit ADCs based on the binary data outputted from the unit ADCs; and an automatic gain control unit for generating automatic gain values based on the output of a spatial ADC. A terminal can be linked to an artificial intelligence module, a drone (unmanned aerial vehicle (UAV)), a robot, an augmented reality (AR) device, a virtual reality (VR) device, a device related to 6G services, and the like.

18 Claims, 17 Drawing Sheets

(58) Field of Classification Search
CPC ........... H04B 1/7115; H04L 1/02; H04L 1/06; H03M 1/12; H03M 1/124; H03M 1/129; H03M 1/18; H03M 1/181; H03M 1/34; H03M 1/20; H03M 7/16
See application file for complete search history.

(56) References Cited

U.S. PATENT DOCUMENTS

| | | | |
|---|---|---|---|
| 10,701,638 B2* | 6/2020 | Lee ..................... | H04B 17/345 |
| 2006/0125672 A1* | 6/2006 | Budzelaar ............. | H03M 1/367 |
| | | | 341/155 |
| 2010/0226421 A1 | 9/2010 | Kibune | |
| 2018/0309487 A1* | 10/2018 | Zhang .................. | H04B 7/0834 |
| 2021/0384932 A1* | 12/2021 | O'Sullivan ........... | H03M 1/128 |

FOREIGN PATENT DOCUMENTS

| | | |
|---|---|---|
| KR | 20040039703 | 5/2004 |
| KR | 20100075486 | 7/2010 |

\* cited by examiner

WIRELESS SIGNAL DIGITAL CONVERSION DEVICE

CROSS-REFERENCE TO RELATED APPLICATIONS

This application is a National Stage application under 35 U.S.C. § 371 of International Application No. PCT/KR2020/011858, filed on Sep. 3, 2020. The disclosure of the prior application is incorporated by reference in its entirety.

TECHNICAL FIELD

The present disclosure relates to a digital conversion device of a wireless signal and, more particularly, to provide a digital conversion device of a wireless signal which can lower power consumption and increase a reception power of a wireless signal.

BACKGROUND ART

A wireless communication system is widely deployed to provide various types of communication services such as voice and data. In general, a wireless communication system is a multiple access system capable of supporting communication with multiple users by sharing available system resources (bandwidth, transmission power, etc.). Examples of the multiple access system include a Code Division Multiple Access (CDMA) system, a Frequency Division Multiple Access (FDMA) system, a Time Division Multiple Access (TDMA) system, a Space Division Multiple Access (SDMA) system, and an Orthogonal Frequency Division Multiple Access (OFDMA) system, SC-FDMA (Single Carrier Frequency Division Multiple Access) system, IDMA (Interleave Division Multiple Access) system, and the like.

As the wireless environment requires a wider bandwidth in the high frequency band, the path attenuation becomes serious, and the signal-to-noise ratio (SNR) is relatively lowed.

A multiple antenna system is used to obtain a high antenna gain, but the conventional multiple antenna system requires a high-resolution analog to digital converter (hereinafter, ADC) with heavy power consumption.

DISCLOSURE

Technical Problem

The present disclosure is to solve the requirement and/or problem.

In addition, the present disclosure is to implement an analogue to digital conversion device of a wireless signal which can lower power consumption and increase resolution.

Technical Solution

According to an embodiment of the present disclosure, a digital conversion device of a wireless signal, comprising: a plurality of antennas for receiving a reception signal of a predetermined range of reception voltage level; a plurality of unit ADC portions one-to-one matched to the antennas and for converting a partial voltage level within the range of the reception voltage level of the reception signal to binary data, wherein the plurality of unit ADC portions converts each of the partial voltage level having different voltage level to binary data; and an encoder for generating a digital code that a voltage level corresponding to the reception voltage level is converted to binary data based on the binary data output from the unit ADC portions.

Furthermore, wherein each of the unit ADC portions includes: a plurality of RF signal processors for adjusting the voltage level of the reception signal based on an automatic gain value; and a plurality of unit ADCs for receiving an input of an in-phase signal and a quadrature-phase signal of each of the RF signal processors, wherein each of the plurality of unit ADCs performs an analogue to digital conversion based on a differential reference voltage.

Furthermore, wherein the encoder generates binary data of a bit lower than a bit of the binary data based on the binary data output from the unit ADCs.

Furthermore, further comprising an automatic gain controller for generating the automatic gain value based on an output of the spatial ADC.

Furthermore, wherein the encoder includes: a plurality of unit encoders for generating a thermometer code from respective binary data output from the unit ADCs; and a spatial encoder for generating binary data of a smaller bit based on the binary data output from each of the unit encoders.

Furthermore, wherein each of the unit encoders outputs data of 1-bit.

Furthermore, wherein the encoder includes m unit encoders, and wherein the encoder generates binary data of n-bit (n is a natural number smaller than m) based on m binary data (m is a natural number) output from the unit encoders, and the binary data of n-bit is generated to be proportional to a value of "1" among the m binary data.

Furthermore, wherein the number of unit encoders is set to "2n−1".

Furthermore, wherein the differential reference voltage input to each of the m spatial encoders is proportional by an integer multiple with each other.

Furthermore, wherein each of the RF signal processors is provided with the automatic gain value of a same size.

Furthermore, wherein the automatic gain value includes: a first automatic gain value input to a low noise amplifier and a second automatic gain value input to a variable gain adjuster.

Furthermore, wherein the first automatic gain value is adjusted such that a different of output signal levels among the low noise amplifiers is less than a preconfigured threshold value.

Furthermore, wherein the automatic gain controller controls the first and second automatic gain values to deactivate the RF signal processor to which the reception antenna is belonged, based on the voltage level of a signal received through an arbitrary antenna being a preconfigured threshold voltage or lower.

Furthermore, wherein the automatic gain controller generates the automatic gain value based on outputs of the unit encoders or the spatial encoders.

Furthermore, wherein the automatic gain controller calculates an instantaneous power based on a square of the in-phase signal and a square of the quadrature-phase signal and calculates the automatic gain value based on a hysteresis of the difference value between the instantaneous power and a target power value.

Furthermore, wherein each of the spatial ADCs operates by using a common clock.

Furthermore, wherein each of the spatial ADCs digital-converts the partial voltage level on a different timing.

DESCRIPTION OF DRAWINGS

The accompanying drawings, which are included to provide a further understanding of the present disclosure and constitute a part of the detailed description, illustrate embodiments of the present disclosure and together with the description serve to explain the principle of the present disclosure.

MODE FOR DISCLOSURE

Figure 1:
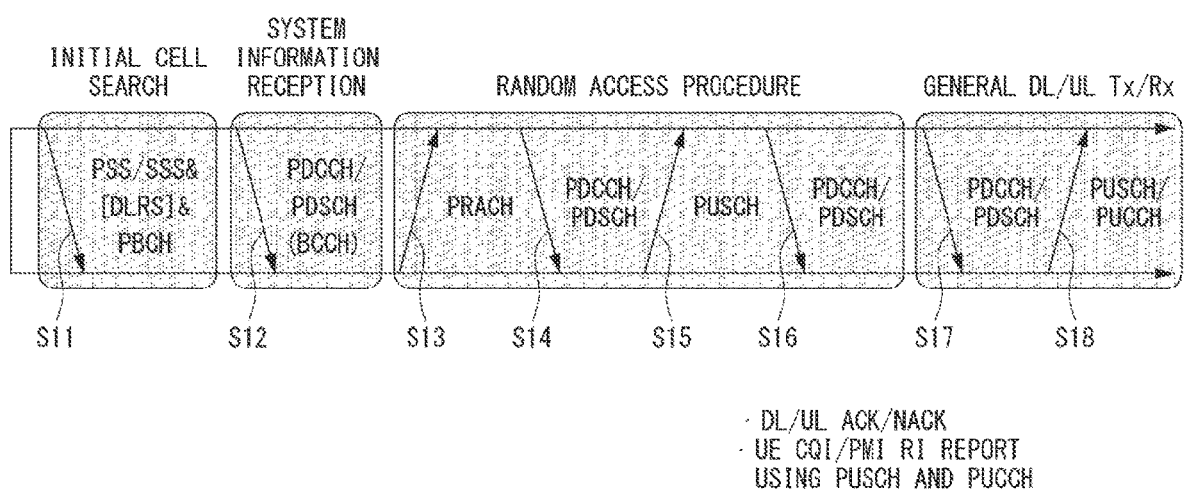
FIG. 1 illustrates physical channels and general signal transmission used in a 3GPP system.

Hereinafter, an embodiment disclosed in the present disclosure will be described in detail with reference to the accompanying drawings and the same or similar components are denoted by the same reference numerals regardless of a sign of the drawing, and duplicated description thereof will be omitted. Suffixes "module" and "unit" for components used in the following description are given or mixed in consideration of easy preparation of the present disclosure only and do not have their own distinguished meanings or roles. Further, in describing an embodiment disclosed in the present disclosure, a detailed description of related known technologies will be omitted if it is determined that the detailed description makes the gist of the embodiment of the present disclosure unclear. Further, it is to be understood that the accompanying drawings are just used for easily understanding the embodiments disclosed in the present disclosure and a technical spirit disclosed in the present disclosure is not limited by the accompanying drawings and all changes, equivalents, or substitutes included in the spirit and the technical scope of the present disclosure are included.

Terms including an ordinary number, such as first and second, are used for describing various elements, but the elements are not limited by the terms. The terms are used only to discriminate one element from another element.

It should be understood that, when it is described that a component is "connected to" or "accesses" another component, the component may be directly connected to or access the other component or a third component may be present therebetween. In contrast, when it is described that a component is "directly connected to" or "directly accesses" another component, it is understood that no element is present between the element and another element.

A singular form includes a plural form if there is no clearly opposite meaning in the context.

In the present application, it should be understood that term "include" or "have" indicates that a feature, a number, a step, an operation, a component, a part or the combination thereof described in the present disclosure is present, but does not exclude a possibility of presence or addition of one or more other features, numbers, steps, operations, components, parts or combinations thereof, in advance.

The following technology may be used in various radio access system including CDMA, FDMA, TDMA, OFDMA, SC-FDMA, and the like. The CDMA may be implemented as radio technology such as Universal Terrestrial Radio Access (UTRA) or CDMA2000. The TDMA may be implemented as radio technology such as a global system for mobile communications (GSM)/general packet radio service (GPRS)/enhanced data rates for GSM evolution (EDGE). The OFDMA may be implemented as radio technology such as Institute of Electrical and Electronics Engineers (IEEE) 802.11 (Wi-Fi), IEEE 802.16 (WiMAX), IEEE 802.20, Evolved UTRA (E-UTRA), or the like. The UTRA is a part of Universal Mobile Telecommunications System (UMTS). 3rd Generation Partnership Project (3GPP) Long Term Evolution (LTE) is a part of Evolved UMTS (E-UMTS) using the E-UTRA and LTE-Advanced (A)/LTE-A pro is an evolved version of the 3GPP LTE. 3GPP NR (New Radio or New Radio Access Technology) is an evolved version of the 3GPP LTE/LTE-A/LTE-A pro. 3GPP 6G may be an evolved version of 3GPP NR.

For clarity of description, the technical spirit of the present disclosure is described based on the 3GPP communication system (e.g., LTE or NR etc), but the technical spirit of the present disclosure are not limited thereto. LTE means technology after 3GPP TS 36.xxx Release 8. In detail, LTE technology after 3GPP TS 36.xxx Release 10 is referred to as the LTE-A and LTE technology after 3GPP TS 36.xxx Release 13 is referred to as the LTE-A pro. The 3GPP NR means technology after TS 38.xxx Release 15. 3GPP 6G may mean technology after TS Release 17 and/or Release 18. "xxx" means standard document detail number. LTE/NR/6G may be collectively referred to as a 3GPP system. For background art, terms, abbreviations, etc. used in the description of the present disclosure, reference may be made to matters described in standard documents published prior to the present disclosure. For example, the following document can be referred to.

3GPP LTE
   36.211: Physical channels and modulation
   36.212: Multiplexing and channel coding
   36.213: Physical layer procedures
   36.300: Overall description
   36.331: Radio Resource Control (RRC)

3GPP NR
   38.211: Physical channels and modulation
   38.212: Multiplexing and channel coding
   38.213: Physical layer procedures for control
   38.214: Physical layer procedures for data
   38.300: NR and NG-RAN Overall Description
   38.331: Radio Resource Control (RRC) protocol specification Physical Channels and Frame Structure Physical Channel and General Signal Transmission FIG. 1 illustrates physical channels and general signal transmission used in a 3GPP system. In a wireless communication system, the UE receives information from the eNB through Downlink (DL) and the UE transmits information from the eNB through Uplink (UL). The information which the eNB and the UE transmit and receive includes data and various control information and there are various physical channels according to a type/use of the information which the eNB and the UE transmit and receive.

When the UE is powered on or newly enters a cell, the UE performs an initial cell search operation such as synchronizing with the eNB (S11). To this end, the UE may receive a Primary Synchronization Signal (PSS) and a (Secondary Synchronization Signal (SSS) from the eNB and synchronize with the eNB and acquire information such as a cell ID or the like. Thereafter, the UE may receive a Physical Broadcast Channel (PBCH) from the eNB and acquire in-cell broadcast information. Meanwhile, the UE receives a Downlink Reference Signal (DL RS) in an initial cell search step to check a downlink channel status.

A UE that completes the initial cell search receives a Physical Downlink Control Channel (PDCCH) and a Physical Downlink Control Channel (PDSCH) according to information loaded on the PDCCH to acquire more specific system information (S12).

Meanwhile, when there is no radio resource first accessing the eNB or for signal transmission, the UE may perform a Random Access Procedure (RACH) to the eNB (S13 to S16). To this end, the UE may transmit a specific sequence to a preamble through a Physical Random Access Channel (PRACH) (S13 and S15) and receive a response message (Random Access Response (RAR) message) for the preamble through the PDCCH and a corresponding PDSCH. In the case of a contention based RACH, a Contention Resolution Procedure may be additionally performed (S16).

The UE that performs the above procedure may then perform PDCCH/PDSCH reception (S17) and Physical Uplink Shared Channel (PUSCH)/Physical Uplink Control Channel (PUCCH) transmission (S18) as a general uplink/downlink signal transmission procedure. In particular, the UE may receive Downlink Control Information (DCI) through the PDCCH. Here, the DCI may include control information such as resource allocation information for the UE and formats may be differently applied according to a use purpose.

Meanwhile, the control information which the UE transmits to the eNB through the uplink or the UE receives from the eNB may include a downlink/uplink ACK/NACK signal, a Channel Quality Indicator (CQI), a Precoding Matrix Index (PMI), a Rank Indicator (RI), and the like. The UE may transmit the control information such as the CQI/PMI/RI, etc., through the PUSCH and/or PUCCH.

Structures of Uplink and Downlink Channels

Downlink Channel Structure

The BS transmits an associated signal to the UE through a downlink channel to be described below and the UE receives the associated signal from the BS through the downlink channel to be described below.

(1) Physical Downlink Shared Channel (PDSCH)

The PDSCH transports downlink data (e.g., DL-shared channel transport block (DL-SCH TB)), and adopts modulation methods such as Quadrature Phase Shift Keying (QPSK), 16 Quadrature Amplitude Modulation (QAM), 64 QAM, and 256 QAM. A codeword is generated by encoding a TB. The PDSCH may carry multiple codewords. Scrambling and modulation mapping are performed for each codeword and modulation symbols generated from each codeword are mapped to one or more layers (layer mapping). Each layer is mapped to a resource together with a demodulation reference signal (DMRS), generated as an OFDM symbol signal, and transmitted through a corresponding antenna port.

(2) Physical Downlink Control Channel (PDCCH)

The PDCCH transports downlink control information (DCI) and a QPSK modulation method is applied. One PDCCH is constituted by 1, 2, 4, 8, and 16 Control Channel Elements (CCEs) according to an Aggregation Level (AL). One CCE is constituted by 6 Resource Element Groups (REGs). One REG is defined by one OFDM symbol and one (P)RB.

The UE performs decoding (so-called, blind decoding) for a set of PDCCH candidates to obtain the DCI transmitted through the PDCCH. The set of PDCCH candidates decoded by the UE is defined as a PDCCH search space set. The search space set may be a common search space or a UE-specific search space. The UE may obtain the DCI by monitoring PDCCH candidates in one or more search space sets configured by the MIB or higher layer signaling.

Uplink Channel Structure

The UE transmits an associated signal to the BS through an uplink channel to be described below and the BS receives the associated signal from the UE through the uplink channel to be described below.

(1) Physical Uplink Shared Channel (PUSCH)

The PUSCH transports uplink data (e.g., UL-shared channel transport block (UL-SCH TB)) and/or uplink control information (UCI) and is transmitted based on a Cyclic Prefix-Orthogonal Frequency Division Multiplexing (CP-OFDM) waveform or a Discrete Fourier Transform-spread-Orthogonal Frequency Division Multiplexing (DFT-s-OFDM) waveform. When the PUSCH is transmitted based on the DFT-s-OFDM waveform, the UE transmits the PUSCH by applying transform precoding. As an example, when the transform precoding is disable (e.g., transform precoding is disabled), the UE transmits the PUSCH based on the CP-OFDM waveform, and when the transform precoding is enabled (e.g., transform precoding is enabled), the UE may transmit the PUSCH based on the CP-OFDM waveform or the DFT-s-OFDM waveform. PUSCH transmission is dynamically scheduled by the UL grant in the DCI or semi-statically scheduled based on higher layer (e.g., RRC) signaling (and/or Layer 1 (L1) signaling (e.g., PDCCH)) (configured grant). The PUSCH transmission may be performed based on a codebook or a non-codebook.

(2) Physical Uplink Control Channel (PUCCH)

The PUCCH may transport uplink control information, HARQ-ACK, and/or scheduling request (SR), and may be divided into multiple PUCCHs according to a PUCCH transmission length.

General Contents of 6G System

A 6G (wireless communication) system has purposes including (i) a very high data rate per device, (ii) a very large number of connected devices, (iii) global connectivity, (iv) a very low latency, (v) reduction of energy consumption of battery-free IoT devices, (vi) ultrahigh reliability connection, (vii) connected intelligence having a machine learning capability, etc. A vision of the 6G system may be four aspects, .e.g., intelligent connectivity, deep connectivity, holographic connectivity, and ubiquitous connectivity, and the 6G system may satisfy requirements shown in Table 1 below. That is, Table 1 shows an example of the requirements of the 6G system.

TABLE 1

| Per device peak data rate | 1 Tbps |
| --- | --- |
| E2E latency | 1 ms |
| Maximum spectral efficiency | 100 bps/Hz |
| Mobility support | Up to 1000 km/hr |
| Satellite integration | Fully |
| AI | Fully |
| Autonomous vehicle | Fully |
| XR | Fully |
| Haptic Communication | Fully |

Figure 2:
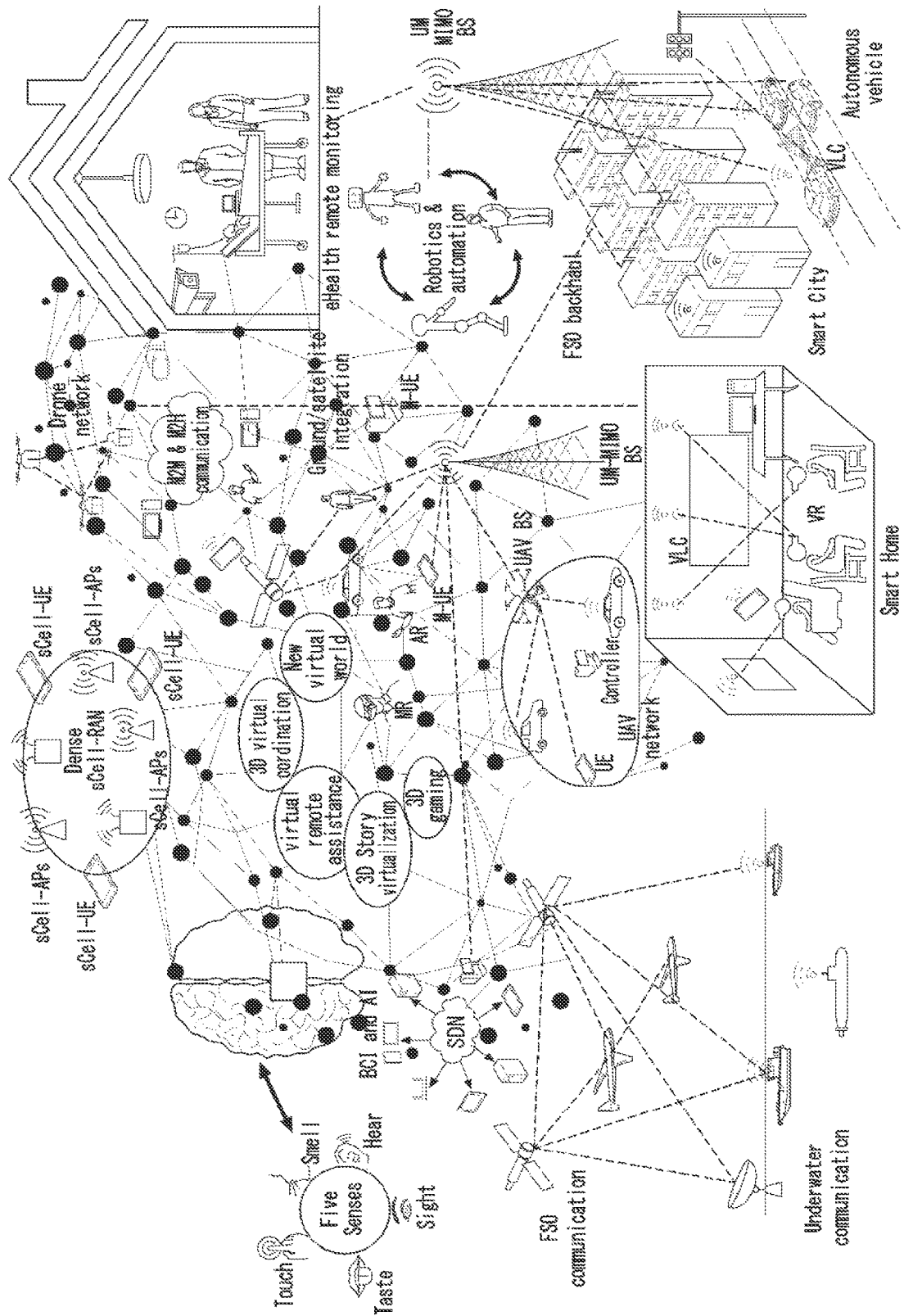
FIG. 2 is a diagram illustrating an example of a communication structure providable in a 6G system.

The 6G system may have key factors such as Enhanced mobile broadband (eMBB), Ultra-reliable low latency communications (URLLC), massive machine-type communication (mMTC), AI integrated communication, Tactile internet, High throughput, High network capacity, High energy efficiency, Low backhaul and access network congestion, and Enhanced data security. FIG. 2 is a diagram illustrating an example of a communication structure providable in a 6G system.

It is anticipated that the 6G system has higher simultaneous wireless communication connectivity which is 50 times higher than the 5G wireless communication system. The URLLC which is the key feature of 5G will be a more important technology by providing a smaller end-to-end latency than 1 ms in the 6G communication. In the 6G system, volume spectrum efficiency will be even more excellent unlike region spectrum efficiency frequently used. The 6G system may provide an advanced battery technology for a very long battery life-span and energy harvesting. In 6G, new network features may be as follows.

Satellites integrated network: It is anticipated that the 6G will be integrated with the satellite in order to provide a global mobile group. Integrating the terrestrial, the satellite, and the aerial network into one wireless communication system is very important for the 6G.

Connected intelligence: Unlike the wireless communication system of the previous generation, the 6G is innovative, and wireless evolution will be updated from "connected things" to "connected intelligence". The AI may be applied in each step (or each procedure of signal processing to be described below) of a communication procedure.

Seamless integration wireless information and energy transfer. The 6G wireless network will transfer power in order to charge batteries of devices like smartphones and sensors. Therefore, wireless information and energy transmission (WIET) will be integrated.

Ubiquitous super 3D connectivity: Connection to networks of networks and core network functions of a drone and a very low earth orbit network will make a super 3D connection in 6G ubiquitous.

Several general requirements may be as follows in new network features of the 6G described above.

Small cell networks: An ID of the small cell network is introduced in order to enhance a received signal quality as a result of enhancement of a throughput, energy efficiency and spectrum efficiency in a cellular system. Consequently, the small cell network is a required feature of communication systems of 6G and beyond 5G (5 GB) or more. Therefore, the 6G communication system also adopts the feature of the small cell network.

Ultra-dense heterogeneous network: Ultra-dense heterogeneous networks will become another important feature of the 6G communication system. A multi-tier network constituted by heterogeneous networks improves entire QoS and reduces cost.

High-capacity backhaul: The backhaul connectivity is characterized as the high-capacity backhaul network in order to support high-capacity traffic. A high-speed optical fiber and free space optic system may be an available solution for such a problem.

Radar technology integrated with mobile technology: High-precision localization (location based service) through communication is one of the functions of the 6G wireless communication system. Therefore, a radar system will be integrated with the 6G network.

Softwarization and virtualization: The softwarization and virtualization are two important functions which become a basis of a design process in the 5 GB network in order to guarantee reconfigurability and programmability. Further, in a sharing physical infrastructure, billions of devices may be shared.

Core Implementation Technology of 6G System

Artificial Intelligence

The AI is most important in the 6G system, and is a technology to be newly introduced. The AI is not involved in the 4G system. The 5G system will support a partial or very limited AI. However, the 6G system will completely support the AI for automation. Development of machine learning will make a more intelligent network for real-time communication in the 6G. When the AI is introduced into communication, real-time data transmission may be simplified and enhanced. The AI may determine a scheme in which a complicated target task is performed by using numerous analyses. That is, the AI may increase efficiency and decrease the processing latency.

Time-consuming task such as handover, network selection, and resource scheduling may be immediately performed by using the AI. The AI may play an important role even in M2M, machine-to-human, and human-to-machine communication. Further, the AI may become rapid communication in a brain computer interface (BCI). An AI based communication system may be supported by a metal material, an intelligent structure, an intelligent network, an intelligent device, an intelligent cognition radio, a self-maintenance network, and machine learning.

In recent years, an attempt to integrate the AI with the wireless communication system has appeared, but this concentrates an application layer and a network layer, in particular, deep learning on a wireless resource management and allocation field. However, this study is gradually developed to a MAC layer and a physical layer, and in particular, there are attempts to combine the deep learning with wireless transmission in a physical layer. AI based physical layer transmission means not a traditional communication framework, but a signal processing and communication mechanism based on an AI driver in a fundamental signal processing and communication mechanism. For example, the AI based physical layer transmission may include channel coding and decoding, deep learning based signal estimation and detection, a deep learning based MIMI mechanism, AI based resource scheduling and allocation, etc.

The machine learning may be used for channel estimation and channel tracking, and used for power allocation, interference cancellation, etc., in a downlink physical layer. Further, the machine learning may also be used for antenna selection, power control, symbol detection, etc., in an MIMO system.

However, application of DNN for transmission in the physical layer may have the following problem.

In a deep learning based AI algorithm, numerous training data are required to optimize training parameters. However, due to a limit in acquiring data in a specific channel environment as the training data, a lot of training data are used offline. This, in the specific channel environment, with respect to static training for the training data, a contradiction may occur between dynamic features and diversity of a radio channel.

Further, current deep learning primarily targets an actual real signal. However, signals of the physical layer of the wireless communication are complex signals. In order to match features of wireless communication signals, a study for a neural network which detects a complex domain signal is further required.

Hereinafter, the machine learning will be described in more detail.

The machine learning means a series of operations of training the machine in order to make a machine which may perform a task which a person may perform or which it is difficult for the person to perform. Data and a learning model are required for the machine learning. A learning method of the data in the machine learning may be generally classified into three, i.e., supervised learning, unsupervised learning, and reinforcement learning.

Learning of a neural network is to minimize an error of an output. The learning of the neural network is a process of repeatedly inputting learning data into the neural network and calculating the output of the neural network for the learning data and the error of a target and back-propagating the errors of the neural network from the output layer of the neural network toward the input layer in a direction to reduce the errors to update the weight of each node of the neural network.

The supervised learning may use learning data in which the learning data is labeled with a correct answer, and the unsupervised learning may use learning data in which not be labeled with the correct answer. That is for example, the learning data in the case of the supervised learning related to the data classification may be data in which category is labeled in each learning data. The labeled learning data is input to the neural network, and the error may be calculated by comparing the output (category) of the neural network with the label of the learning data. The calculated error is back-propagated in a reverse direction (i.e., a direction from the output layer toward the input layer) in the neural network and connection weights of respective nodes of each layer of the neural network may be updated according to the back propagation. A variation amount of the updated connection weight of each node may be determined according to a learning rate. Calculation of the neural network for the input data and the back-propagation of the error may constitute a learning cycle (epoch). A learning rate may be applied differently according to the number of repetition times of the learning cycle of the neural network. For example, in an initial stage of the learning of the neural network, the neural network ensures a certain level of performance quickly by using a high learning rate, thereby increasing efficiency and a low learning rate is used in a latter stage of the learning, thereby increasing accuracy.

The learning method may vary depending on a feature of data. For example, when a purpose is to accurately predict data by a transmitter by a receiver on the communication system, it is more preferable to perform learning by using the supervised learning than the unsupervised learning or reinforcement learning.

The learning model corresponds to a human brain, and a most basic linear model may be considered, but a paradigm of a machine learning a neural network structure having high complexity such as artificial neural networks as the learning model is referred to the deep learning.

A neural network core used as the learning scheme generally includes deep neural networks (DNN), convolutional deep neural networks (CNN), and recurrent neural networks (RNN) (recurrent Boltzman machine) schemes.

The artificial neural network is an example of connecting several perceptrons.

Figure 3:
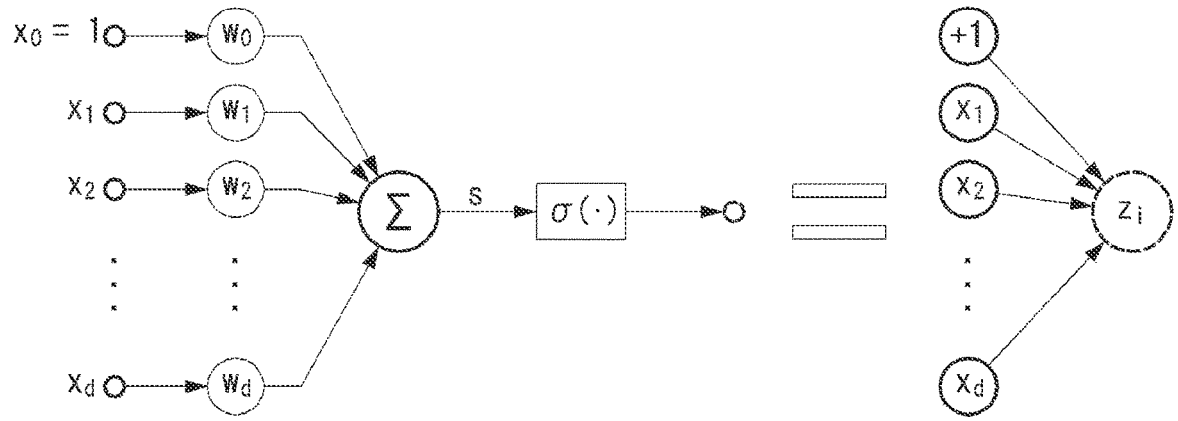
FIG. 3 illustrates a perceptron structure.

Referring to FIG. 3, when an input vector x=(18, 19, . . . , xd) is input, an entire process of multiplying each component by weights (17, W2, . . . , Wd), and aggregating all of the results are aggregated, and then applying an active function $\sigma(\cdot)$ is referred to as perceptron. A massive artificial neural network structure extends a simplified perceptron structure illustrated in FIG. 3 to apply the input vector to different multi-dimension perceptrons. For convenience of description, an input value or an output value is referred to as a node.

Meanwhile, it may be described that the perceptron structure illustrated in FIG. 3 is constituted by a total of three layers based on the input value and the output value. An artificial neural network in which there are H (d+1)-dimension perceptrons between a 1st layer and a 2nd layer and K (H+1)-dimension perceptrons between the 2nd layer and a 3rd layer may be expressed as in FIG. 4.

Figure 4:
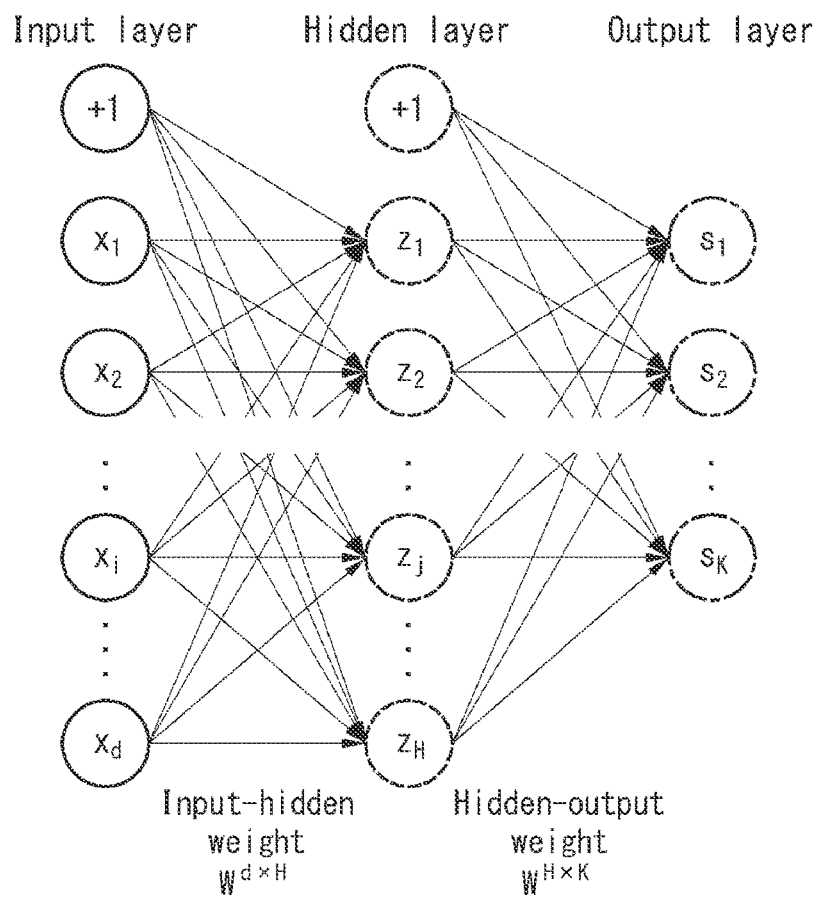
FIG. 4 illustrates a multi-perceptron structure.

An input layer on which the input vector is located is referred to as an input layer, an output layer on which a final output value is located is referred to as an output layer, and all layers located between the input layer and the output layer are referred to as a hidden layer. In the illustration of FIG. 4, three layers are disclosed, but when the actual number of artificial neural network layers is counted, the number is counted except for the input layer, so the actual number of artificial neural network layers may be regarded as a total of two layers. The artificial neural network is configured by connecting a perceptron of a basic block in two dimensions.

The input layer, hidden layer, and output layer may be commonly applied in various artificial neural network structures such as CNN, RNN, etc., to be described below in addition to a multi-layer perceptron. As the number of hidden layers increases, the artificial neural network is deeper, and a machine learning paradigm that uses a sufficiently deepened artificial neural network as the learning model is referred to as deep learning. Further, the artificial neural network used for the deep learning is referred to as a deep neural network (DNN).

Figure 5:
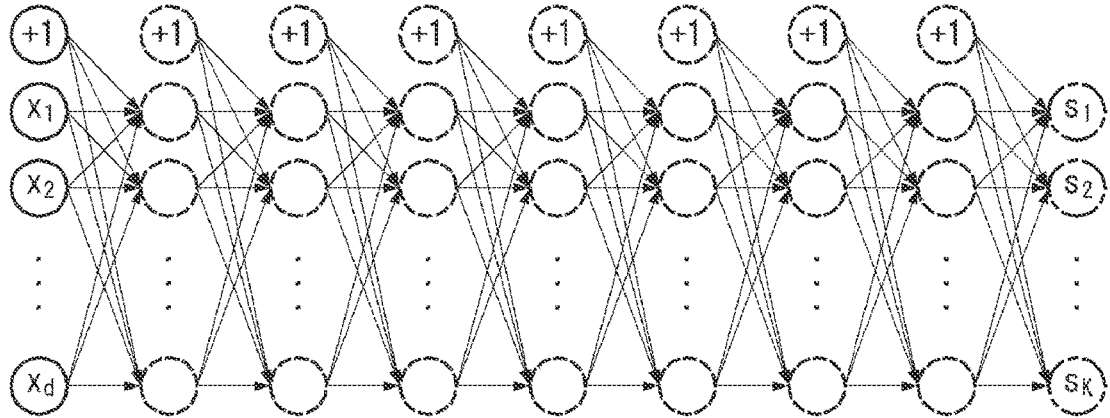
FIG. 5 illustrates a deep neural network structure.

The DNN illustrated in FIG. 5 is a multi-layer perceptron constituted by eight hidden layer+output layer. The multi-layer perceptron structure is expressed as a fully-connected neural network. In the fully-connected neural network, there is no connection relationship between nodes located on the same layer, and there is the connection relationship only between nodes located on adjacent layers. The DNN has a fully-connected neural network structure, and is configured by a combination of multiple hidden layers and active functions, and may be usefully applied to determining correlation features between an input and an output. Her, the correlation features may mean a joint probability of the input and the output.

Meanwhile, various artificial neural network structures different from the DNN may be formed according to how a plurality of perceptrons being connected to each other.

In the DNN, nodes located inside one layer are disposed in a 1-dimensional vertical direction. However, in FIG. 6, a case where w horizontal nodes and h vertical nodes are disposed in two dimensions with respect to the nodes may be assumed (a convolutional neural network structure of FIG. 6). In this case, since a weight is added per one connection in a connection process connected from one input node to the hidden layer, a total of h×w weights should be considered. Since there are h×w nodes in the input layer, a total of h2w2 weights are required between two adjacent layers.

Figure 6:
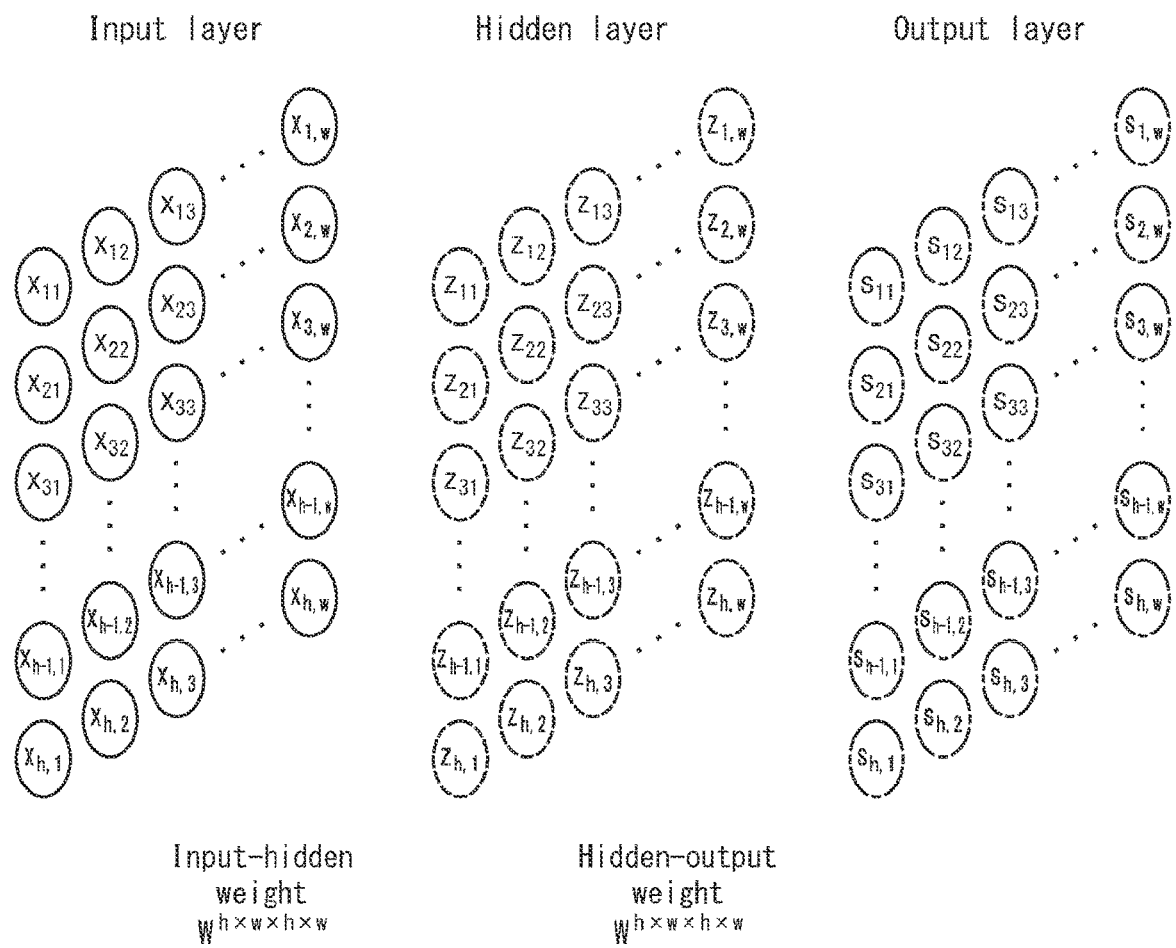
FIG. 6 illustrates a convolutional neural network structure.
Figure 7:
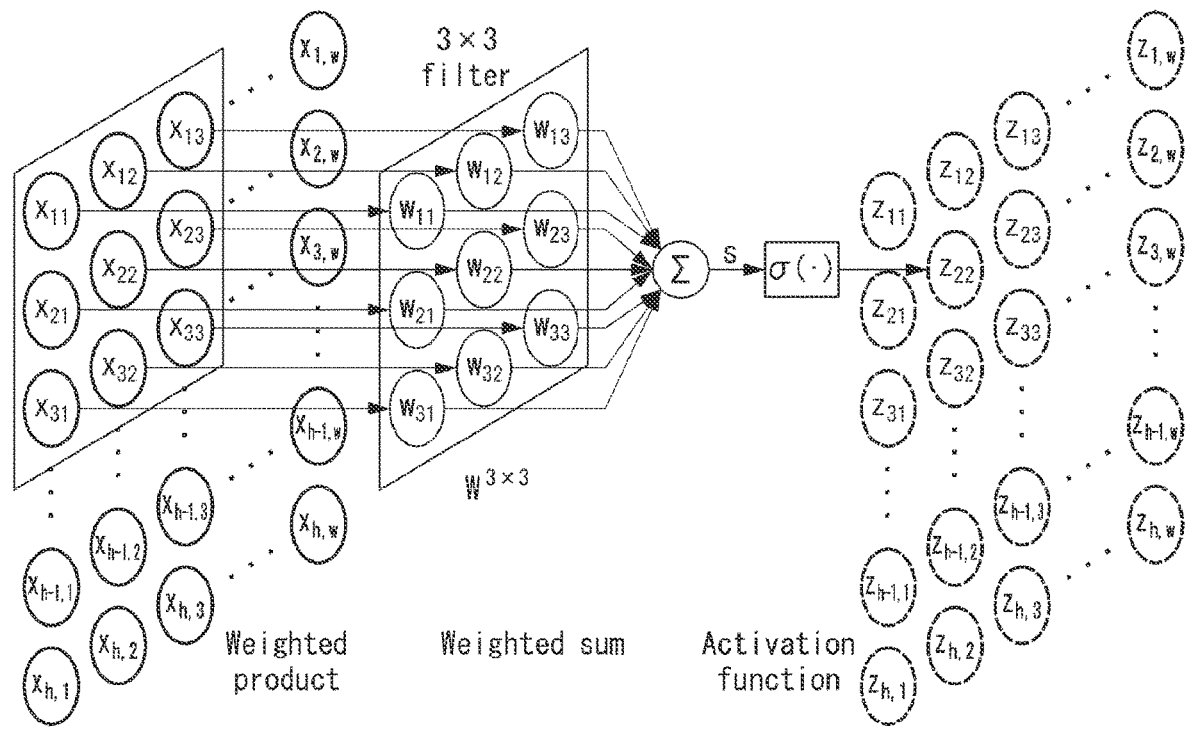
FIG. 7 illustrates a filter operation in a convolutional neural network.

The convolutional neural network of FIG. 6 has a problem in that the number of weights exponentially increases according to the number of connections, so by assuming that there is a small-sized filter instead of considering all mode connections between the adjacent layers, a weighted sum and an active function operation are performed with respect to a portion where the filters are overlapped as illustrated I FIG. 7.

One filter has weights corresponding to a number as large as a size thereof, and the weight may be learned so as to extract and output any specific feature on the image as a factor. In FIG. 7, a 3×3-sized filter is applied to an uppermost left end 3×3 region of the input layer, and an output value of a result of performing the weighted sum and the active function operation for the corresponding node is stored in z22.

The filter performs the weighted sum and active function operation while moving at predetermined horizontal and vertical intervals while scanning the input layer, and the output value thereof is located at a position of a current filter. 'Such an operation scheme is similar to a conventional operation for an image in a computer vision field, so the DNN having such a structure is referred to as a convolutional neural network (CNN) and a hidden layer generated as the result of the convolutional operation is referred to as a convolutional layer. Further, a neural network in which there is a plurality of convolutional layers is referred to as a deep convolutional neural network (DCNN).

In the convolutional layer, in the node at which the current filter is located, only a node located at a region covered by the filter is included to calculate the weighted sum, thereby reducing the number of weights. As a result, one filter may be used to concentrate on a feature for a local region. As a result, the CNN may be effectively applied to image data processing in which a physical distance in a 2D region becomes an important determination criteron. Meanwhile, in the CNN, a plurality of filters may be applied just before the convolutional layer, and a plurality of output results may also be generated through the convolutional operation of each filter.

Meanwhile, there may be data in which sequence features are important. A structure applying a scheme of inputting one element on a data sequence every timestep by considering a length variability and a time order of the sequence data, and inputting an output vector (hidden vector) of the hidden layer output at a specific time jointly with a just next element on the sequence to the artificial neural network is referred to a recurrent neural network structure.

Figure 8:
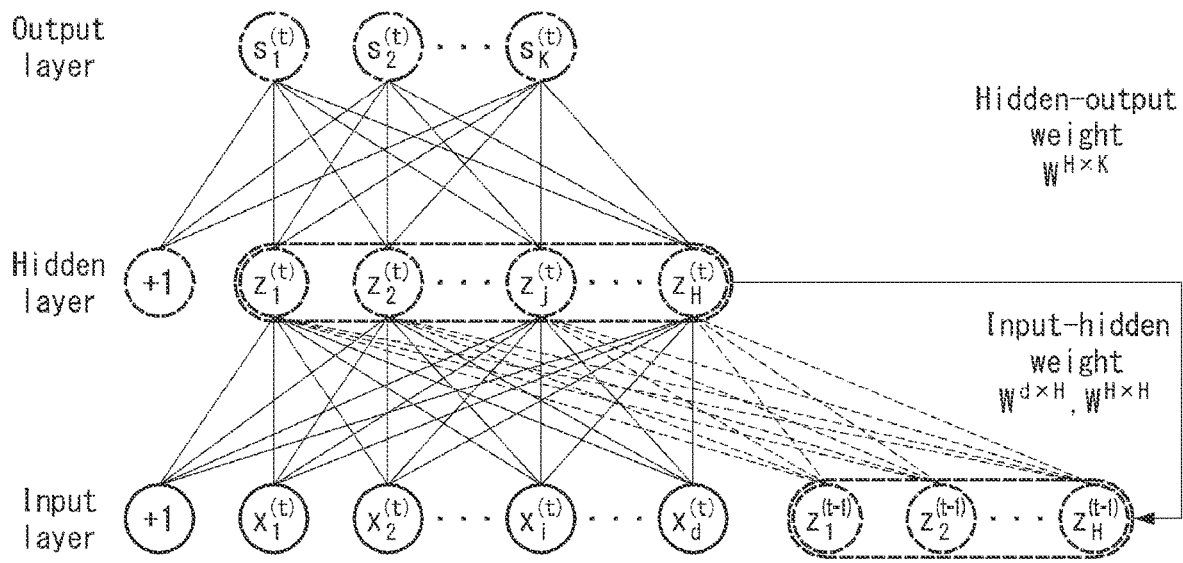
FIG. 8 illustrates a neural network structure in which a recurrent loop is present.
Figure 9:
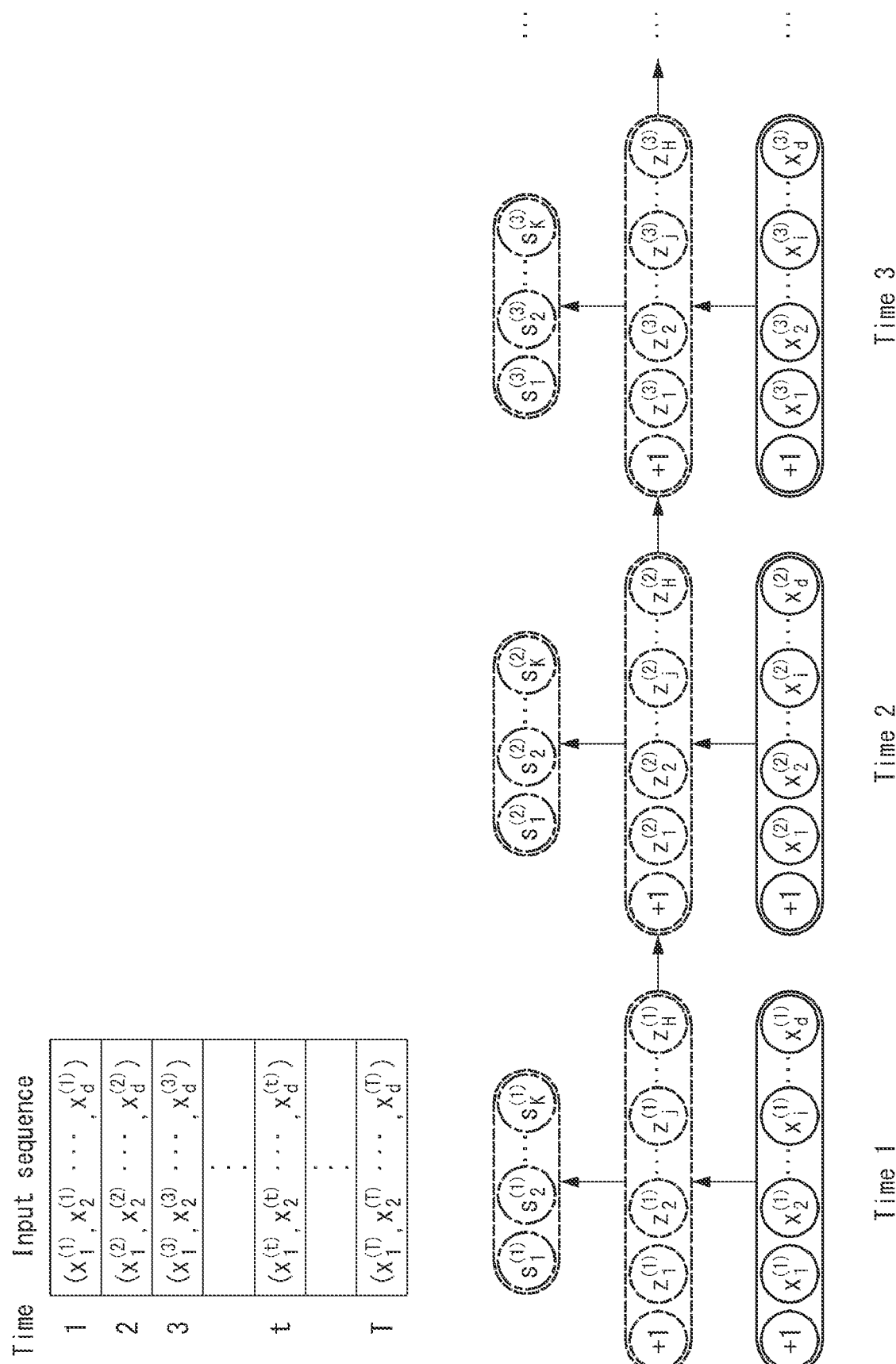
FIG. 9 illustrates an operating structure of a recurrent neural network.

Referring to FIG. 8, the recurrent neural network (RNN) is a structure of applying the weighted sum and the active function by jointly inputting hidden vectors (z1(t–1), z2(t–1), . . . , zH(t–1)) at an immediately previous time t–1 in the process of elements (18(t), 19(t), . . . , xd(t)) at any time t on the data sequence. A reason for transferring the hidden vector to a subsequent time is that it is regarded that information in the input vector at the previous times is accumulated in the hidden vector at the current time.

Referring to FIG. 8, the RNN operates according to a predetermined time order with respect to the input data sequence.

A hidden vector (z1(1), z2(1), . . . , zH(1)) when an input vector (18(t), 19(t), . . . , xd(t)) at time 1 is input into the RNN is input jointly with an input vector (18(2), 19(2), . . . , xd(2)) at time 2 to determine a vector (z1(2), z2(2), . . . , zH(2)) of the hidden layer through the weighted sum and the active function. Such a process is repeatedly performed up to time 2, time 3, . . . , time T.

Meanwhile, when a plurality of hidden layers is disposed in the RNN, this is referred to as a deep recurrent neural network (DRNN). The RNN is usefully applied to the sequence data (e.g., natural language processing) and designed.

The neural network core used as the learning scheme may include various deep learning techniques such as a Restricted Boltzman Machine (RBM), deep belief networks (DBN), and a Deep Q-Network in addition to the DNN, the CNN, and the RNN, and may be applied to fields such as computer vision, voice recognition, natural language processing, voice/signal processing, etc.

In recent years, an attempt to integrate the AI with the wireless communication system has appeared, but this concentrates an application layer and a network layer, in particular, deep learning on a wireless resource management and allocation field. However, this study is gradually developed to a MAC layer and a physical layer, and in particular, there are attempts to combine the deep learning with wireless transmission in a physical layer. AI based physical layer transmission means not a traditional communication framework, but a signal processing and communication mechanism based on an AI driver in a fundamental signal processing and communication mechanism. For example, the AI based physical layer transmission may include channel coding and decoding, deep learning based signal estimation and detection, a deep learning based MIMI mechanism, AI based resource scheduling and allocation, etc.

Terahertz (THz) Communication

Figure 10:
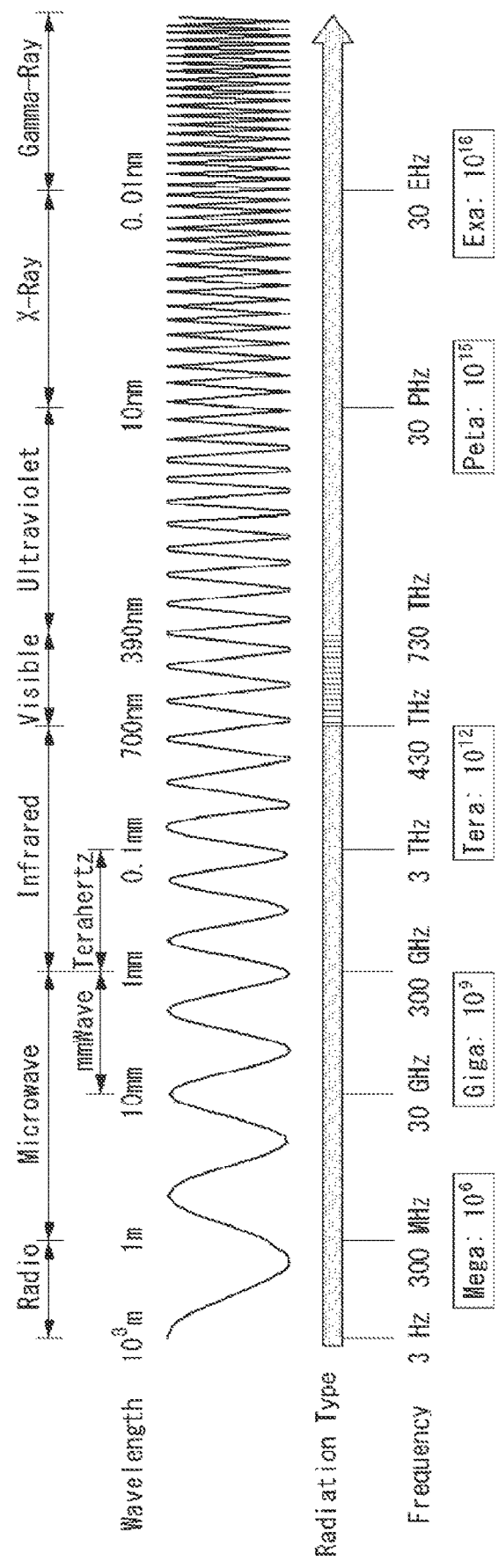
FIG. 10 illustrates an example of an electromagnetic spectrum.

The data rate may increase a bandwidth. This may be performed by using sub-THz communication with a wide bandwidth, and applying an advanced massive MIMO technology. A THz wave also known as a radiation of millimeters or less generally shows a frequency band between 0.1 THz and 10 THz having a corresponding wavelength in the range of 0.03 mm to 3 mm. A 100 GHz to 300 GHz band range (sub THz band) is regarded as a primary part of the THz for cellular communication. When the sub-THz band is added to a mmWave band, a 6G cellular communication capacity increases. 300 GHz to 3 THz in a defined THz band is present in an infrared (IR) frequency band. The 300G Hz to 3 THz band is a part of a wideband, but is present on a boundary of the wideband, and is present just behind an RF band. Therefore, the 300G Hz to 3 THz band shows a similarity to the RF. FIG. 10 illustrates an example of an electromagnetic spectrum.

The THz wave may be located between the radio frequency (RF)/millimeter (mm), and the IR band, and (i) may better transmit a non-metallic/non-polarizable material than visible light/infrared rays, and have a smaller wavelength than the RF/millimeter wave, and has a high straightness, and may be capable of focusing a beam. Further, since photon energy of the THz wave is only a few meV, the photon energy is harmless to the human body. A frequency band which is expected to be used for the THz wireless communication may be a D-band (110 GHz to 170 GHz) or an H-band (220 GHz to 325 GHz) having small radio wave loss by molecular absorption in the air. The standardization of the THz wireless communication is discussed around the IEEE 802.15 THz working group in addition to 3GPP, and a standard document issued by the IEEE 802.15 Task Group (TG3d, TG3e) may embody or supplement the contents described in the present disclosure. The THz wireless communication may be applied in wireless cognition, sensing, imaging, wireless communication, THz navigation, etc. Primary features of the THz communication include (i) a bandwidth widely usable to support a very high data rate, and (ii) a high path loss generated at a high frequency (a high directional antenna is required). A narrow beam width generated by the high directional antenna reduces interference. A small wavelength of the THz signal may allow even more antenna elements to be integrated into a device and a BS which operate in this band. Through this, an advanced adaptive arrangement technology capable of range limitation may be used.

Figure 11:
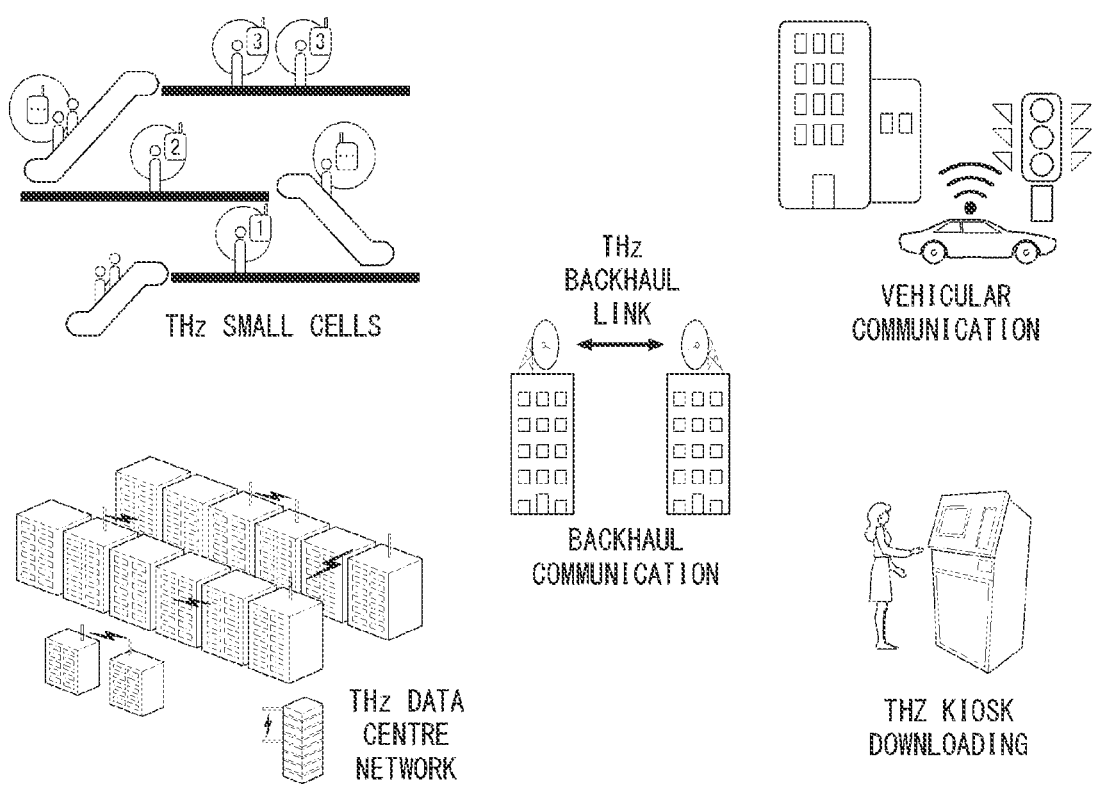
FIG. 11 illustrates an example of THz communication application.

FIG. 11 illustrates an example of THz communication application.

As illustrated in FIG. 11, a THz wireless communication scenario may be categorized into a macro network, a micro network, and a nanoscale network. In the macro network, the THz wireless communication may be applied to a vehicle-to-vehicle connection and a backhaul/fronthaul connection. In the micro network, the THz wireless communication may be applied to an indoor small cell, a fixed point-to-point or multi-point connection such as wireless connection in a data center, and near-field communication such as kiosk downloading.

Table 2 below is a table that shows an example a technology which may be used in the THz wave.

TABLE 2

| | |
|---|---|
| Transceivers Device | Available immature: UTC-PD, RTD and SBD |
| Modulation and coding | Low order modulation techniques (OOK, QPSK), LDPC, Reed Soloman, Hamming, Polar, Turbo |
| Antenna | Omni and Directional, phased array with low number of antenna elements |
| Bandwidth | 69 GHz (or 23 GHz) at 300 GHz |
| Channel models | Partially |
| Data rate | 100 Gbps |
| Outdoor deployment | No |
| Free space loss | High |
| Coverage | Low |
| Radio Measurements | 300 GHz indoor |
| Device size | Few micrometers |

Optical Wireless Technology

An OWC technology is planed for 6G communication in addition to RF based communication for all available device-to-access networks. The network is connected to a network-to-backhaul/fronthaul network connection. The OWC technology is already used after the 4G communication system, but may be more widely used for meeting the requirements of the 6G communication system. The OWC technologies such as light fidelity, visible light communication, optical commerce communication, and FSO communication based on the wideband are already well known technologies. The optical wireless technology based communication may provide a very high data speed, a low latency time, and safe communication. LiDAR may also be used for superultra high resolution 3D mapping in the 6G communication based on the wideband.

FSO Backhaul Network

Transmitter and receiver features of the FSO system are similar to the features of the optical fiber network. Therefore, data transmission of the FSO system is similar to that of the optical fiber system. Therefore, the FSO may become an excellent technology that provides the backhaul connection in the 6G system jointly with the optical fiber network. When the FSO is used, very long-distance communication is enabled even in a distance of 10000 km or more. The FSO supports a massive backhaul connection for remote and non-remote regions such as the seat, the space, the underwater, and an isolated island. The FSO also supports a cellular BS connection.

Massive MIMO Technology

One of the core technologies for enhancing the spectrum efficiency is application of the MIMO technology. When the MIMO technology is enhanced, the spectrum efficiency is also enhanced. Therefore, the massive MIMO technology will be important in the 6G system. Since the MIMO technology uses multiple paths, a multiplexing technology and a beam generation and operating technology suitable for the THz band should also be considered importantly so that the data signal is transmitted through one or more paths.

Blockchain

The blockchain will become an important technology for managing mass data in a future communication system. The blockchain is a form of a distributed ledger technology, and the distributed ledger is a database distributed in numerous nodes or computing devices. Each node replicates and stores the same ledger copy. The blockchain is managed by a P2P network. The blockchain may be present without being managed by a centralized agency or server, but may be present. Data of the blockchain is jointly collected and constituted by blocks. The blocks are connected to each other, and protected by using encryption. The blockchain fundamentally perfectly complements massive IoT through enhanced interoperability security, personal information protection, stability, and scalability. Therefore, the blockchain technology provides various functions such as inter-device interoperability, massive data traceability, autonomous interactions of different IoT systems, and massive connection stability of the 6G communication system.

3D Networking

The 6G system supports user communication of vertical scalability by integrating ground and aerial networks. A 3D BS will be provided through a low-orbit satellite and a UAV. When a new dimension is added in terms of an altitude and a related degree of freedom, a 3D connection is quire different from the existing 2D network.

Quantum Communication

In the context of the 6G network, unsupervised reinforcement learning of the network is promising. The supervised learning scheme may designate a label in a vast amount of data generated in the 6G. The labeling is not required in the unsupervised learning. Therefore, the technology may be used for autonomously constructing a complicated network expression. When the reinforcement learning and the unsupervised learning are combined, the network may be operated by a true autonomous scheme.

Unmanned Aerial Vehicle (UAV)

The unmanned aerial vehicle (UAV) or a drone will become an important element in the 6G wireless communication. In most cases, a high-speed data wireless connection is provided by using a UAV technology. A BS entity is installed in the UAV in order to provide the cellular connection. The UAV has a specific function which may not be seen in a fixed BS infrastructure, such as easy deployment, strong visible-line link, the degree of freedom in which mobility is controlled. During emergency situations such as natural disaster, the placement of a ground communication infrastructure is not enabled to be economically realized, and sometimes may not provide services in volatile environments. The UAV may easily handle this situation. The UAV will become a new paradigm of a wireless communication field. This technology facilitates three basic requirements of the wireless network, i.e., eMBB, URLLC, and mMTC/The UAV may also support various purposes such as network connectivity enhancement, fire sensing, disaster emergency services, securing and monitoring, pollution monitoring, parking monitoring, accident monitoring, etc. Therefore, the UAV technology is recognized as one of the most important technologies for the 6G communication.

Cell-Free Communication

The close integration of multiple frequencies and heterogeneous communication technologies is very important in the 6G system. As a result, the user may move smoothly from the network to another network without the need of creating any manual configuration in the device. A best network is automatically selected in an available communication technology. This will break the limitation of a cell concept in the wireless communication. Currently, user movement from one cell to another cell causes too many handovers in the network, and causes handover failures, handover latency, data loss, and pingpong effects. 6G cell-free communication will overcome all of the problems, and provide a better QoS. The cell-free communication will be achieved through different heterogeneous radios of multi-connectivity and multi-tier hybrid technologies and devices.

Wireless Information and Energy Transmission Integration

WIET uses the same field and wave as the wireless communication system. In particular, the sensor and the smartphone will be charged by using wireless power transmission during communication. The WIET is a promising technology for extending the life-span of a battery charging wireless system. Therefore, a device without the battery will be supported in the 6G communication.

Integration of Sensing and Communication

An autonomous wireless network is a function to continuously an environmental state which is dynamically changed, and exchange information between different nodes. In the 6G, the sensing will be closely integrated with the communication in order to an autonomous system.

Integration of Access Backhaul Network

In the 6G, the density of the access network will be enormous. Each access network is connected by the backhaul network such as the optical fiber and the FSO network. In order to cope with a very larger number of access networks, there will be a close integration between the access and the backhaul network.

Hologram and Beamforming

The beamforming is a signal processing procedure of adjusting an antenna array in order to transmit a radio signal. The beamforming is a sub-set of a smart antenna or advanced antenna system. The beamforming technology has several advantages such as a high call-to-noise ratio, interference prevention and denial, and high network efficiency. The hologram and beamforming (HBF) is a new beamforming method which is significantly different from the MIMO system because a software-defined antenna is used. The HBF will be a very effective approach scheme for efficient and flexible transmission and reception of the signal in a multi-antenna communication device.

Big Data Analysis

The big data analysis is a complicated process for analyzing various large-scale data sets or big data. This process guarantees perfect data management by finding hidden data, and information such as a correlation and a customer tendency which may not be known. The big data is collected from various sources such as a video, a social network, an image, and the sensor. This technology is widely used to processing vast data in the 6G system.

Large Intelligent Surface (LIS)

A THz band signal has a strong straightness, so there may be a lot of shade regions due to obstacles, and an LIS technology will be important in which the LIS is installed near such a shade region to expand a communication zone and to enable communication stability strengthening and additional services. The LIS is an artificial surface made of electromagnetic materials, and may change propagations of incoming radio waves and outgoing radio waves. The LIS may be shown as an extension of massive MIMO, but is different from the massive MIMO in terms of an array structure and an operating mechanism. Further, the LIS has an advantage of maintaining low power consumption in that the LIS operates as a reconfigurable reflector having passive element, i.e., reflects the signal only passively without using an active RF chain. Further, since each passive reflector of the LIS should independently control a phase shift of an incident signal, the reflector may be advantage for the wireless communication channel. By appropriately controlling the phase shift through an LIS controller, a reflected signal may be gathered in a target receiver in order to boost a received signal power.

The 6G communication technology described above may be applied in combination with methods proposed in the present disclosure to be described below or may be supplemented to specify or clarify technical features of the methods proposed in the present disclosure. On the other hand, the communication service proposed by the present disclosure may be applied in combination with a communication service by 3G, 4G, and/or 5G communication technology in addition to the 6G communication technology described above.

Hereinafter, a digital conversion device of a wireless signal is described in detail, which receives a wireless signal from an antenna and converts the received wireless signal to a digital signal.

Figure 12:
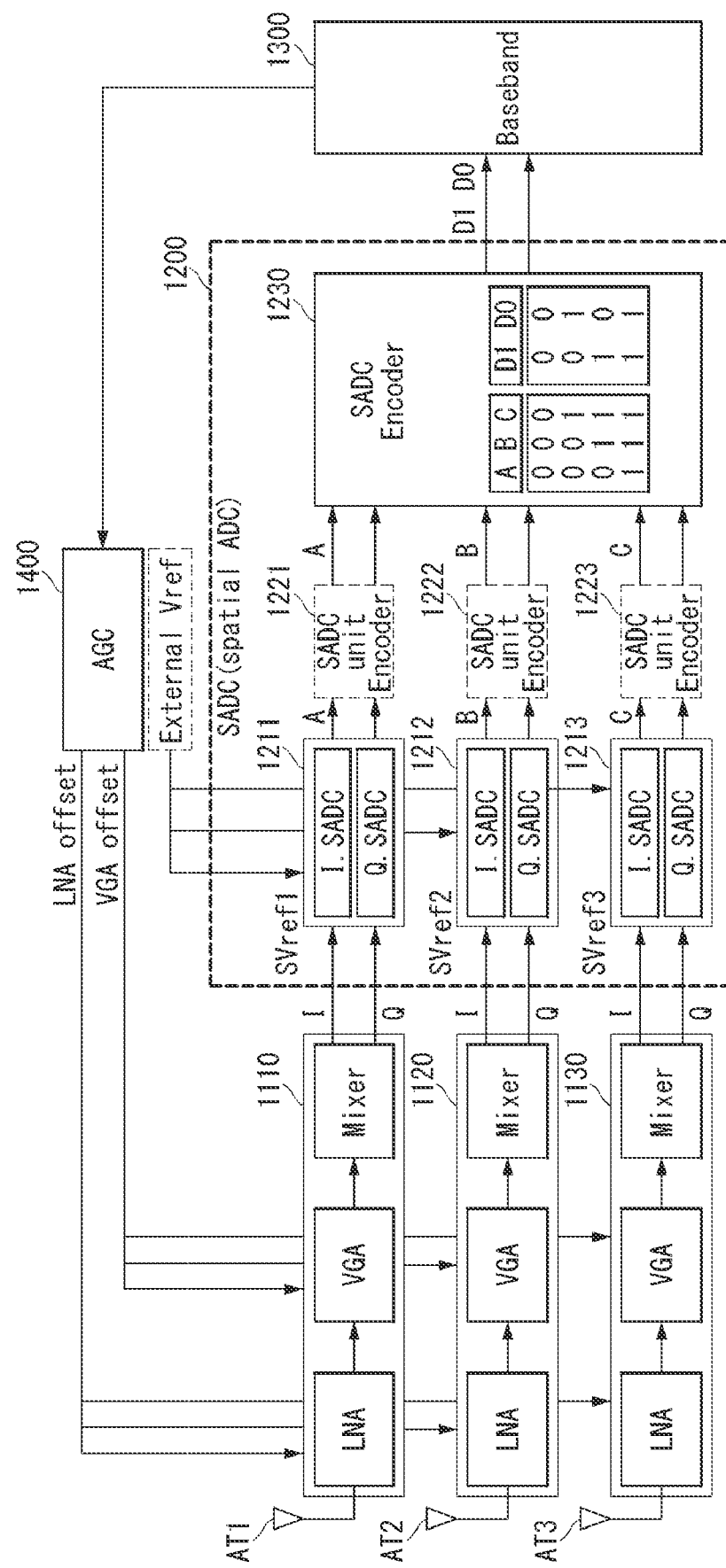
FIG. 12 is a diagram illustrating a digital conversion device of a wireless signal according to an embodiment of the present disclosure.

FIG. 12 is a diagram illustrating a digital conversion device of a wireless signal according to an embodiment of the present disclosure.

Referring to FIG. 12, a digital conversion device of a wireless signal according to a first embodiment of the present disclosure includes first to third antennas AT1, AT2, and AT3, a plurality of unit ADC portions, and encoders 1221, 1222, 1223, and 1230. Hereinafter, the embodiment based on a flash ADC as the unit ADC portions is mainly described.

The antennas AT receive an RF signal. A phase of the RF signal received by the antennas AT is aligned with respect to an input signal of the unit ADCs 1211, 1212, and 1213. The phase of the signal received by the antennas AT are different with each other depending on an incident angle, and the like. The phase of the received signal is aligned before being inputted to a spatial ADC portion 1200, that is, in the state of an analogue signal.

A plurality of unit ADC portions is one-to-one matched to the antennas AT1, AT2, and AT3, and each of the plurality of unit ADC portions converts the reception signal received by each of the antennas AT1, AT2, and AT3 to a digital signal.

A particular embodiment for the flash ADC based unit ADCs is as follows.

The unit ADC portions include an RF signal processor and a unit ADC. A first unit ADC portion includes a first RF signal processor 1110 and a first unit ADC 1211, a second first unit ADC portion includes a second RF signal processor 1210 and a second unit ADC 1212, and a third unit ADC portion includes a third RF signal processor 1130 and a third unit ADC 1213.

Each of the first to third RF signal processors 1110, 1120, and 1130 receives a wireless signal and adjusts a voltage level of the wireless signal based on an automatic gain values (LNA offset, VGA offset). In the first embodiment, the RF signal processors 1110, 1120, and 1130 include the first to third RF signal processors 1110, 1120, and 1130, but the number of the RF signal processors 1110, 1120, and 1130 is not limited thereto.

Each of the RF signal processors 1110, 1120, and 1130 includes an antenna AT, a low noise amplifier (LNA), a variable gain adjuster (VGA), and a mixer.

The low noise amplifiers (LNAs) amplify the reception signal having very low power level due to the influence of attenuation and noise in the signal received by the antenna AT. The variable gain adjusters (VGAs) adjust an output voltage level of the low noise amplifier. The variable gain adjusters (VGAs) perform a gain adjustment for a down-converted signal by the mixer with respect to an input signal of the spatial ADC portion 1200.

The spatial ADC portion 1200 includes the unit ADCs 1211, 1212, and 1213 and the encoders 1221, 1222, 1223, and 1230.

The spatial ADC portion 1200 performs the same function of a single ADC by using the plurality of unit ADCs 1211, 1212, and 1213. A dynamic range of the spatial ADC portion 1200 is distributed by the plurality of unit ADCs 1211, 1212, and 1213. For example, in the case that the voltage level received by the antennas AT1, AT2, and AT3 is Vmin to Vmax(in this case, Vmin<Vmax), the first unit ADC 1211 may convert the voltage in Vmin to V1 range (in this case, V1 is a voltage greater than Vmin and smaller than Vmax) to a digital voltage, the second unit ADC 1212 may convert the voltage in V1 to V2 range (in this case, V2 is a voltage greater than V1 and smaller than Vmax) to a digital voltage, and the third unit ADC 1213 may convert the voltage in V2 to Vmax range (in this case, V3 is a voltage greater than V2 and smaller than Vmax) to a digital voltage.

In addition, each of the unit ADCs 1211, 1212, and 1213 may digital-convert the partial voltage level on a different timing.

FIG. 12 shows the spatial ADC portion 1200 including the three unit ADCs 1211, 1212, and 1213, but the number of unit ADCs is not limited thereto. Each of the ADCs 1211, 1212, and 1213 receives an input of an in-phase signal (hereinafter, I signal) and a quadrature-phase signal (hereinafter, Q signal) of each of the RF signal processors and each of the plurality of unit ADCs 1211, 1212, and 1213 performs an analogue to digital conversion based on a different differential reference voltage.

Each of the first to third unit ADCs 1211, 1212, and 1213 includes an in-phase unit ADC (I_ADC) and an antiphase unit ADC (Q_ADC). Each of the in-phase unit ADCs (I_ADCs) receives the I signal from the RF signal processor and converts the I signal to a digital signal. The antiphase unit ADC (Q_ADC) receives the Q signal from the RF signal processor and converts the Q signal to a digital signal.

Each of the first to third unit ADCs 1211, 1212, and 1213 performs an analogue to digital conversion based on a different differential reference voltage.

The encoders 1221, 1222, 1223, and 1230 generate binary data of a bit lower than the binary data based on the binary data output from the unit ADCs 1211, 1212, and 1213.

The encoders 1221, 1222, 1223, and 1230 include the unit encoders 1221, 1222, and 1223 and the spatial encoder 1230. The unit encoders 1221, 1222, and 1223 generate a thermometer code from respective binary data output from the unit ADCs 1211, 1212, and 1213. That is, the unit encoders 1221, 1222, and 1223 are connected to the RF signal processors 1110, 1120, and 1130 in one-to-one manner, and each of the unit encoders 1221, 1222, and 1223 converts the signal output from the respective RF signal processors 1110, 1120, and 1130 to a digital signal.

The spatial encoder 1230 generates binary data of a smaller bit based on the binary data output from each of the unit encoders 1221, 1222, and 1223. For example, m (m is a natural number) unit encoders 1221, 1222, and 1223 may output m binary data, and the spatial encoder 1230 may generate binary data of n-bit (n is a natural number smaller than m).

The spatial encoder 1230 may output the generated binary data to a baseband 1300.

An example of the spatial encoder 1230 generating the binary data is described as below.

The first unit ADC 1211 compares an output voltage of the first unit ADC 1110 with a first differential reference voltage SVref1. When the output voltage of the first unit ADC 1110 is the first differential reference voltage SVref1 or greater, the first unit ADC 1211 outputs binary data having a value of "1". Alternatively, when the output voltage of the first unit ADC 1110 is less than the first differential reference voltage SVref1, the first unit ADC 1211 outputs binary data having a value of "0".

The second unit ADC 1212 compares an output voltage of the second unit ADC 1120 with a second differential reference voltage SVref2. When the output voltage of the second unit ADC 1120 is the second differential reference voltage SVref2 or greater, the second unit ADC 1212 outputs binary data having a value of "1". Alternatively, when the output voltage of the second unit ADC 1120 is less than the second differential reference voltage SVref2, the second unit ADC 1212 outputs binary data having a value of "0".

The third unit ADC 1213 compares an output voltage of the third unit ADC 1130 with a third differential reference voltage SVref3. When the output voltage of the third unit ADC 1130 is the third differential reference voltage SVref3 or greater, the third unit ADC 1213 outputs binary data having a value of "1". Alternatively, when the output voltage of the third unit ADC 1130 is less than the third differential reference voltage SVref3, the third unit ADC 1211 outputs binary data having a value of "0".

The first to third differential reference voltage SVref1 to SVref3 are generated in proportional to the reference voltage Vref, and the sizes thereof are differently configured.

When the spatial ADC portion 1200 outputs binary data of b-bit, the number (m) of the unit ADCs 1211, 1212, and 1213 may be set to "(2n−1)". For example, as shown in FIG. 12, when the spatial ADC portion 1200 outputs binary data of 2-bit, the unit ADCs may be configured with the first to third unit ADCs 1211, 1212, and 1213.

In addition, m differential reference voltages applied to m unit ADCs may be configured to "$\{i/(m+1)\} \times Vref$" (here, i is a natural number of 1 or more and m or less). For example, the first differential reference voltage SVref1 applied to the first unit ADC 1211 may be configured to "$\{1/(3+1)\} \times Vref$", the second differential reference voltage SVref2 applied to the second unit ADC 1212 may be configured to "$\{2/(3+1)\} \times Vref$", and the third differential reference voltage SVref3 applied to the third unit ADC 1213 may be configured to "$\{3/(3+1)\} \times Vref$".

Each of the first to third differential reference voltage SVref1 to SVref3 may be generated inside of the first to third unit ADCs 1211, 1212, and 1213, respectively, and provided from an exterior.

The reference voltage Vref is configured to implement an effective degree of precision of the unit encoders 1221, 1222, and 1223 which are distributed to the respective RF signal processors. The reference voltage Vref may be preconfigured according to the resolution of the spatial ADC.

The spatial encoder 1230 generates binary data to be proportional to the number of binary data having a value of "1" output by the unit encoders 1221, 1222, and 1223. In the case that the number of unit encoders is 3, the binary data having a value of "1" may be "0 to 3". In the case that the thermometer code of the spatial encoder 1230 is binary data of 3-bit configured with "A-B-C", an output of the first unit encoder 1221 determines the first bit corresponding to "A", an output of the second unit encoder 1222 determines the second bit corresponding to "B", and an output of the third unit encoder 1223 determines the third bit corresponding to "C".

The spatial encoder 1230 may output a digital code of "00" based on that a bit of the thermometer code is "000". In addition, the spatial encoder 1230 may output a digital code of "01" based on that a bit of the thermometer code is "001", output a digital code of "10" based on that a bit of the thermometer code is "011", and output a digital code of "11" based on that a bit of the thermometer code is "111".

An automatic gain controller 1400 generates the automatic gain value based on the output of the spatial ADC.

Figure 13:
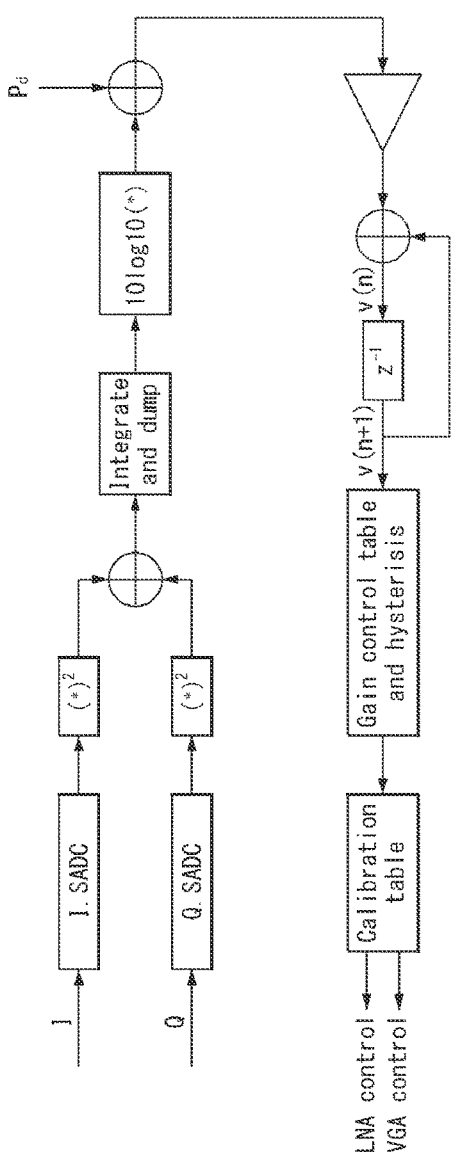
FIG. 13 is a diagram illustrating an operation of the automatic gain controller according to the first embodiment.
Figure 14:
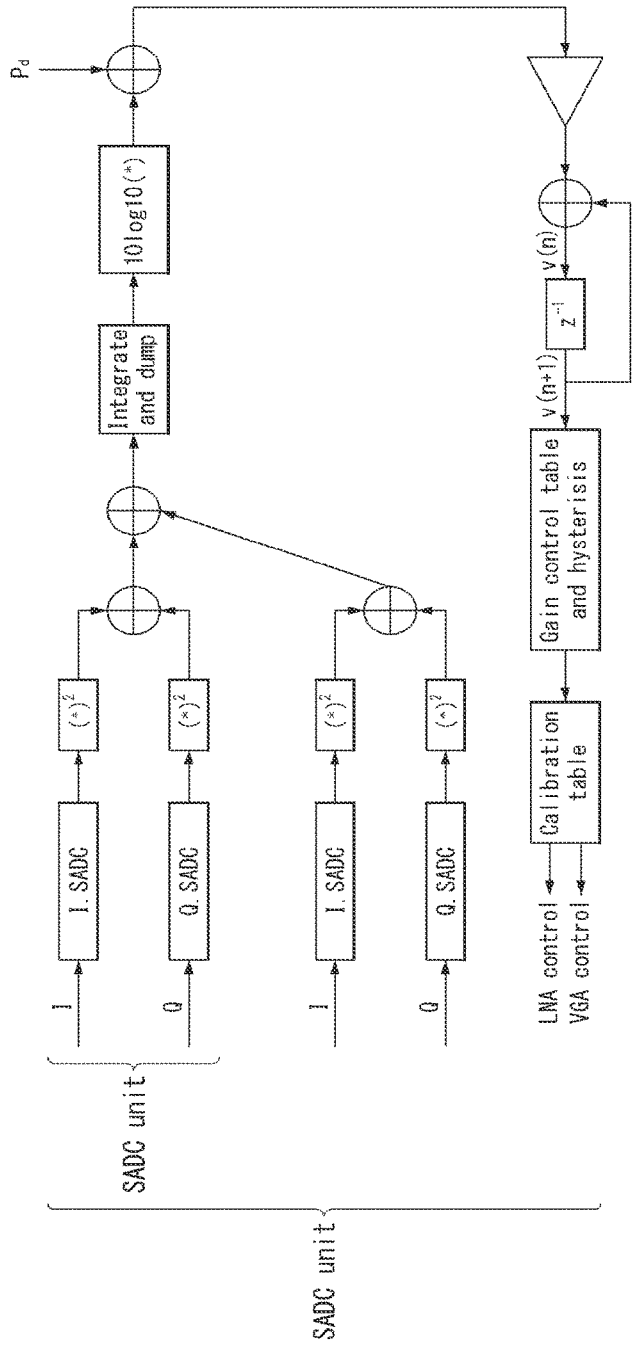
FIG. 14 is a diagram illustrating an operation of the automatic gain controller according to the first embodiment.

FIGS. 13 and 14 are diagrams illustrating an operation of the automatic gain controller.

FIG. 13 is a diagram illustrating an operation of the automatic gain controller according to the first embodiment.

Referring to FIG. 13, the automatic gain controller 1400 according to the first embodiment generates the first and second automatic gain values (LNA offset, VGA offset) based on the output of the spatial ADC.

The automatic gain controller 1400 may obtain an instantaneous power based on the output of the spatial ADC portion 1200. That is, the automatic gain controller 1400 may add a square of the I signal and a square of the Q signal output from the spatial ADC portion 1200 and calculate the instantaneous power of the spatial ADC portion 1200.

The automatic gain controller 1400 may calculate a difference between the instantaneous power value of the spatial ADC portion 1200 and a target power value Pd of the spatial ADC portion 1200.

Furthermore, the automatic gain controller 1400 obtains hysteresis of the difference value between the instantaneous power value and the target power value Pd by using a loop filter. In addition, the automatic gain controller 1400 may search a gain control table and obtain the first automatic gain value LNA offset and the second automatic gain value VGA offset that correspond to the difference value between the instantaneous power value and the target power value Pd. The automatic gain controller 1400 may use a calibration table in the process of obtaining the first automatic gain value LNA offset and the second automatic gain value VGA offset.

FIG. 14 is a diagram illustrating an operation of the automatic gain controller according to the first embodiment.

Referring to FIG. 14, the automatic gain controller 1400 according to the second embodiment generates the first and second automatic gain values (LNA offset, VGA offset) based on the output of the spatial ADC.

The automatic gain controller 1400 may obtain an instantaneous power based on the output from each of the unit ADCs 1211, 1212, and 1213. For example, the automatic gain controller 1400 may add a square of the I signal and a square of the Q signal output from the first unit ADC 1211 and calculate the instantaneous power of the first unit ADC 1211. Likewise, the automatic gain controller 1400 may obtain an instantaneous power of each of the second unit ADC 1212 and the third unit ADC 1213.

The automatic gain controller 1400 may calculate the instantaneous power of the spatial ADC portion 1200 by adding the instantaneous power of each of the first to third unit ADCs 1211, 1212, and 1213.

The automatic gain controller 1400 calculates a difference between the instantaneous power value of the spatial ADC portion 1200 and the target power value Pd.

Furthermore, the automatic gain controller 1400 obtains hysteresis of the difference value between the instantaneous power value of the spatial ADC portion 1200 and the target power value Pd of the spatial ADC portion 1200 by using a loop filter. In addition, the automatic gain controller 1400 may search a gain control table and obtain the first automatic gain value LNA offset and the second automatic gain value VGA offset that correspond to the difference value between the instantaneous power value and the target power value Pd. The automatic gain controller 1400 may use a calibration table in the process of obtaining the first automatic gain value LNA offset and the second automatic gain value VGA offset.

The first automatic gain value LNA offset may be adjusted such that a difference of the output signal levels among the low noise amplifier (LNA) is minimized.

In addition, the automatic gain controller 1400 may activate or deactivated selectively each of the RF signal processors 1110, 1120, and 1130. The spatial ADC portion 1200 operates as a single virtual ADC by using a plurality of the reception antennas AT and a plurality of the RF signal processors 1110, 1120, and 1130. That is, each of the reception antennas AT and the RF signal processors 1110, 1120, and 1130 has its own operating area (dynamic range). In the case that the voltage level of the signal received in an arbitrary reception antenna AT is a preconfigured threshold voltage or lower, the automatic gain controller 1400 may control the first and second automatic gain values (LNA offset and VGA offset) to deactivate the RF signal processor to which the reception antenna AT is belonged.

In the embodiment of the present disclosure, the automatic gain controller 1400 may be included in the baseband 1300 or implemented outside of the baseband 1300.

Each of the unit spatial ADCs operates based on a common clock and on the same timing. Accordingly, an occurrence of an input sampling signal mismatch may be prevented among the unit spatial ADCs. For this, a synchronizer or error correction circuit for synchronizing the common clock may be included.

Figure 15:
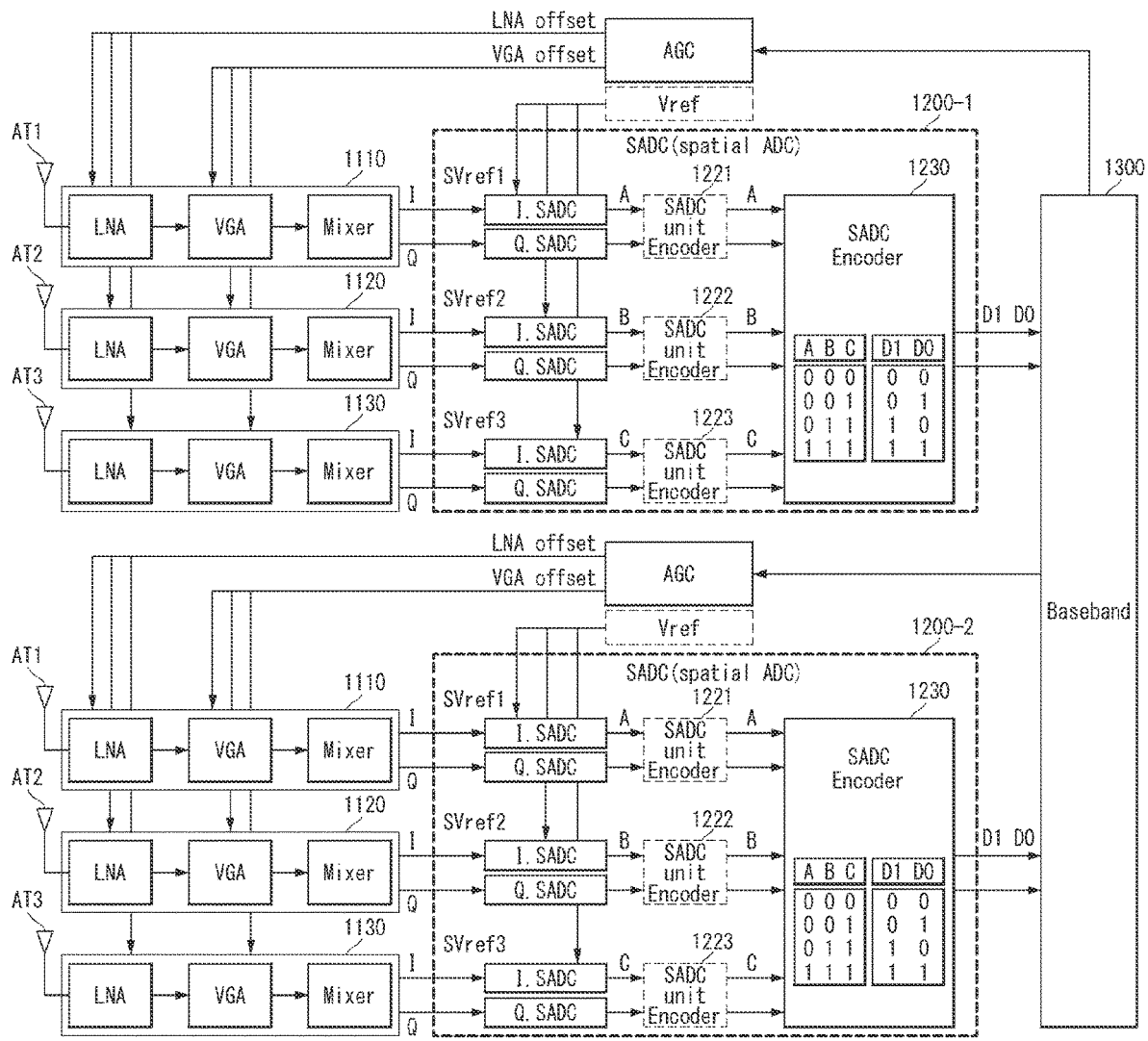
FIG. 15 is a diagram illustrating a digital conversion device of a wireless signal according to another embodiment of the present disclosure.

FIG. 15 is a diagram illustrating a digital conversion device of a wireless signal according to another embodiment of the present disclosure.

As shown in FIG. 15, a digital conversion device of a wireless signal according to another embodiment may include a first spatial ADC portion 1200-1 and a second spatial ADC portion 1200-2.

The first and second spatial ADC portion 1200-1 and 1200-2 may generate three binary data according to a voltage received from each of the plurality of RF signal processors 1110, 1120, and 1130, and based on this, output binary data of 2-bit. The binary data of 2-bit output from each of the first and second spatial ADC portion 1200-1 and 1200-2 may be provided to the single baseband 1300. The first and second spatial ADC portion 1200-1 and 1200-2 may use the same reference voltage Vref and based on this, generate the same differential reference voltage SVref1 to SVref3.

Figure 16:
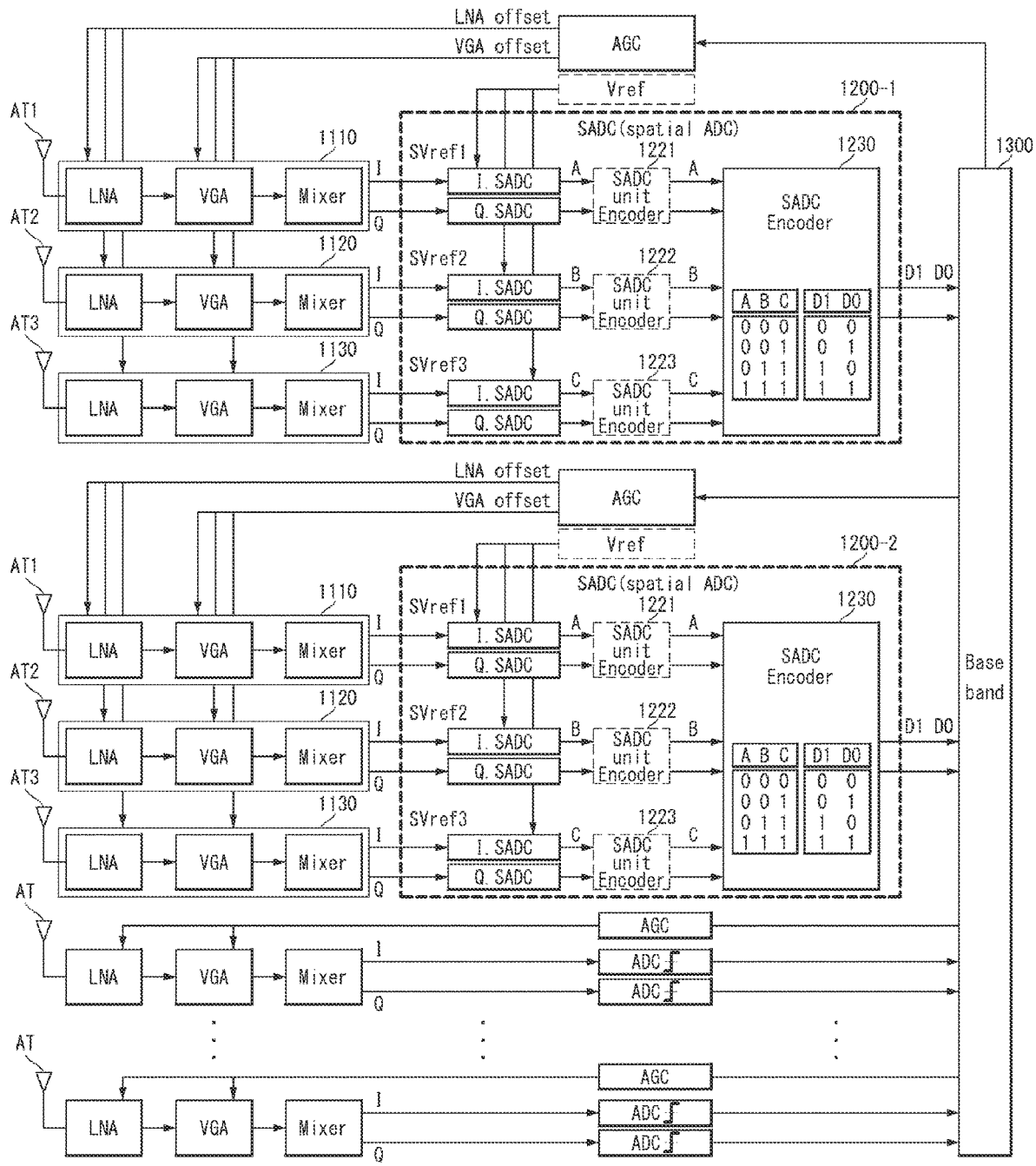
FIG. 16 is a diagram illustrating a digital conversion device of a wireless signal according to still another embodiment of the present disclosure.

FIG. 16 is a diagram illustrating a digital conversion device of a wireless signal according to still another embodiment of the present disclosure.

As shown in FIG. 16, a digital conversion device of a wireless signal according to still another embodiment may include the first spatial ADC portion 1200-1, the second spatial ADC portion 1200-2, and one or more normal ADC N_ADCs.

The first and second spatial ADC portion 1200-1 and 1200-2 may generate three binary data according to a voltage received from each of the plurality of RF signal processors 1110, 1120, and 1130, and based on this, output binary data of 2-bit. The binary data of 2-bit output from each of the first and second spatial ADC portion 1200-1 and 1200-2 may be provided to the single baseband 1300. The first and second spatial ADC portion 1200-1 and 1200-2 may use the same reference voltage Vref and based on this, generate the same differential reference voltage SVref1 to SVref3.

Each of the normal ADC N_ADCs converts a signal received from a single reception antenna to a digital signal.

The data output by the first and second spatial ADC portion 1200-1 and 1200-2, and the normal ADC N_ADCs are provided to the single baseband 1300.

Devices Used in Wireless Communication Systems

Although not limited thereto, various proposals of the present disclosure described above can be applied to various fields requiring wireless communication/connection (eg, 6G) between devices.

Hereinafter, it will be more specifically illustrated with reference to the drawings. In the following drawings/description, the same reference numerals may represent the same or corresponding hardware blocks, software blocks or functional blocks unless otherwise specified.

Figure 17:
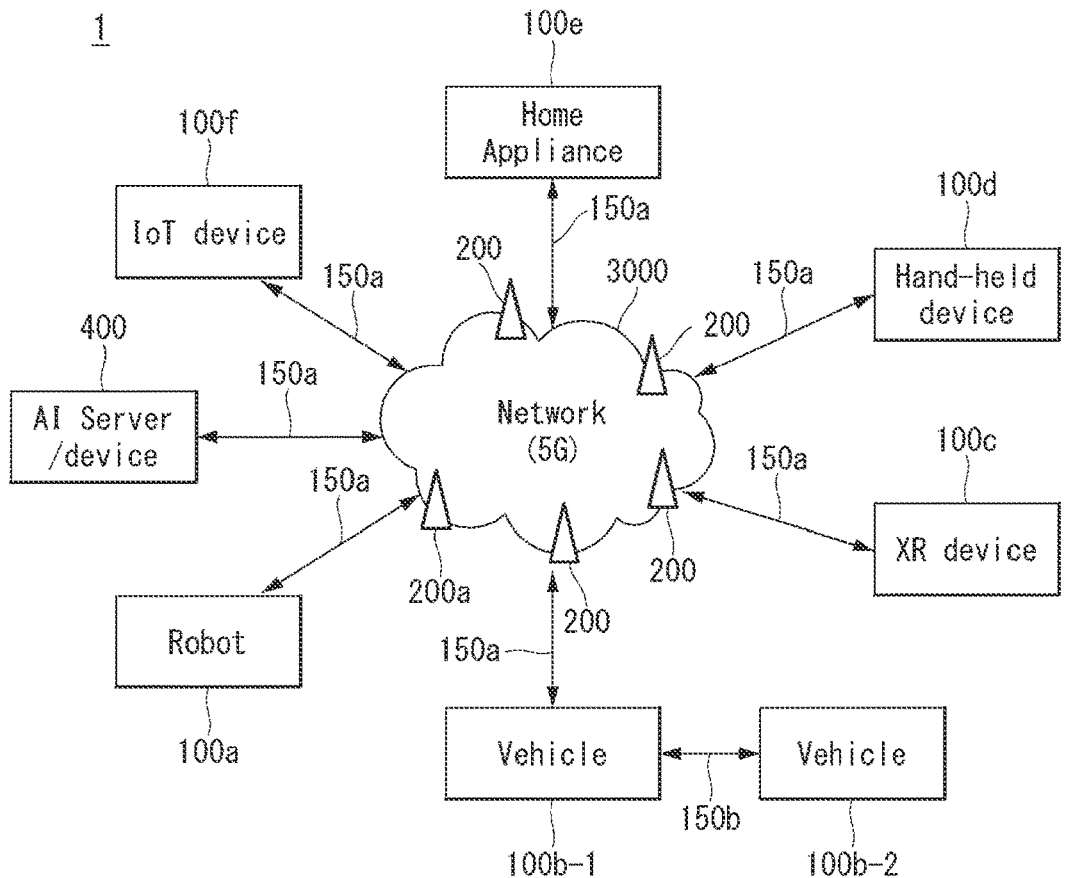
FIG. 17 illustrates a communication system applied to the present disclosure.

FIG. 17 illustrates a communication system 1 applied to the present disclosure.

Referring to FIG. 17, a communication system 1 applied to the present disclosure includes wireless devices, Base Stations (BSs), and a network. Herein, the wireless devices represent devices performing communication using Radio Access Technology (RAT) (e.g., 5G New RAT (NR)) or Long-Term Evolution (LTE)) and may be referred to as communication/radio/5G devices. The wireless devices may include, without being limited to, a robot 100a, vehicles 100b-1 and 100b-2, an eXtended Reality (XR) device 100c, a hand-held device 100d, a home appliance 100e, an Internet of Things (IoT) device 100f, and an Artificial Intelligence (AI) device/server 400. For example, the vehicles may include a vehicle having a wireless communication function, an autonomous driving vehicle, and a vehicle capable of performing communication between vehicles. Herein, the vehicles may include an Unmanned Aerial Vehicle (UAV) (e.g., a drone). The XR device may include an Augmented Reality (AR)/Virtual Reality (VR)/Mixed Reality (MR) device and may be implemented in the form of a Head-Mounted Device (HMD), a Head-Up Display (HUD) mounted in a vehicle, a television, a smartphone, a computer, a wearable device, a home appliance device, a digital signage, a vehicle, a robot, etc. The hand-held device may include a smartphone, a smartpad, a wearable device (e.g., a smartwatch or a smartglasses), and a computer (e.g., a notebook). The home appliance may include a TV, a refrigerator, and a washing machine. The IoT device may include a sensor and a smartmeter. For example, the BSs and the network may be implemented as wireless devices and a specific wireless device 200a may operate as a BS/network node with respect to other wireless devices.

The wireless devices 100a to 100f may be connected to the network 300 via the BSs 200. An AI technology may be applied to the wireless devices 100a to 100f and the wireless devices 100a to 100f may be connected to the AI server 400 via the network 300. The network 300 may be configured using a 3G network, a 4G (e.g., LTE) network, or a 5G (e.g., NR) network. Although the wireless devices 100a to 100f may communicate with each other through the BSs 200/network 300, the wireless devices 100a to 100f may perform direct communication (e.g., sidelink communication) with each other without passing through the BSs/network. For example, the vehicles 100b-1 and 100b-2 may perform direct communication (e.g. Vehicle-to-Vehicle (V2V)/Vehicle-to-everything (V2X) communication). The IoT device (e.g., a sensor) may perform direct communication with other IoT devices (e.g., sensors) or other wireless devices 100a to 100f.

Wireless communication/connection 150a, 150b may be performed between the wireless devices 100a to 100f/base station 200-base station 200/wireless devices 100a to 100f. Here, wireless communication/connection may be performed through various radio access technologies (eg, 5G NR) for uplink/downlink communication 150a and sidelink communication 150b (or D2D communication). Through the wireless communication/connection 150a and 150b, the wireless device and the base station/wireless device may transmit/receive radio signals to each other. For example, the wireless communication/connection 150a and 150b may transmit/receive signals through various physical channels based on all/partial processes of FIG. To this end, based on the various proposals of the present disclosure, various configuration information setting processes for transmitting/receiving radio signals, various signal processing processes (eg, channel encoding/decoding, modulation/demodulation, resource mapping/demapping, etc.) At least a part of a resource allocation process may be performed.

Figure 18:
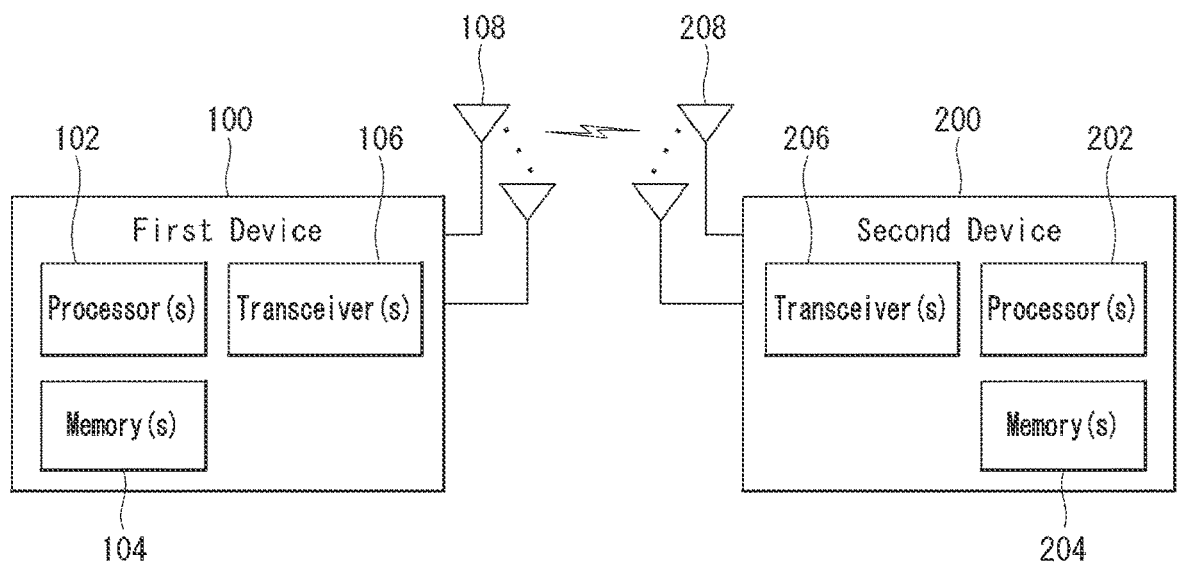
FIG. 18 illustrates a wireless device that can be applied to the present disclosure.

FIG. 18 illustrates wireless devices applicable to the present disclosure.

Referring to FIG. 18, a first wireless device 100 and a second wireless device 200 may transmit radio signals through a variety of RATs (e.g., LTE and NR). Herein, {the first wireless device 100 and the second wireless device 200} may correspond to {the wireless device 100x and the BS 200} and/or {the wireless device 100x and the wireless device 100x} of FIG. 17.

The first wireless device 100 may include one or more processors 102 and one or more memories 104 and additionally further include one or more transceivers 106 and/or one or more antennas 108. The processor(s) 102 may control the memory(s) 104 and/or the transceiver(s) 106 and may be configured to implement the descriptions, functions, procedures, proposals, methods, and/or operational flowcharts disclosed in this document. For example, the processor(s) 102 may process information within the memory(s) 104 to generate first information/signals and then transmit radio signals including the first information/signals through the transceiver(s) 106. The processor(s) 102 may receive radio signals including second information/signals through the transceiver 106 and then store information obtained by processing the second information/signals in the memory(s) 104. The memory(s) 104 may be connected to the processor(s) 102 and may store a variety of information related to operations of the processor(s) 102. For example, the memory(s) 104 may store software code including commands for performing a part or the entirety of processes controlled by the processor(s) 102 or for performing the descriptions, functions, procedures, proposals, methods, and/or operational flowcharts disclosed in this document. Herein, the processor(s) 102 and the memory(s) 104 may be a part of a communication modem/circuit/chip designed to implement RAT (e.g., LTE or NR). The transceiver(s) 106 may be connected to the processor(s) 102 and transmit and/or receive radio signals through one or more antennas 108. Each of the transceiver(s) 106 may include a transmitter and/or a receiver. The transceiver(s) 106 may be interchangeably used with Radio Frequency (RF) unit(s). In the present disclosure, the wireless device may represent a communication modem/circuit/chip.

The second wireless device 200 may include one or more processors 202 and one or more memories 204 and additionally further include one or more transceivers 206 and/or one or more antennas 208. The processor(s) 202 may control the memory(s) 204 and/or the transceiver(s) 206 and may be configured to implement the descriptions, functions, procedures, proposals, methods, and/or operational flowcharts disclosed in this document. For example, the processor(s) 202 may process information within the memory(s) 204 to generate third information/signals and then transmit radio signals including the third information/signals through the transceiver(s) 206. The processor(s) 202 may receive radio signals including fourth information/signals through the transceiver(s) 106 and then store information obtained by processing the fourth information/signals in the memory(s) 204. The memory(s) 204 may be connected to the processor(s) 202 and may store a variety of information related to operations of the processor(s) 202. For example, the memory(s) 204 may store software code including commands for performing a part or the entirety of processes controlled by the processor(s) 202 or for performing the descriptions, functions, procedures, proposals, methods, and/or operational flowcharts disclosed in this document. Herein, the processor(s) 202 and the memory(s) 204 may be a part of a communication modem/circuit/chip designed to implement RAT (e.g., LTE or NR). The transceiver(s) 206 may be connected to the processor(s) 202 and transmit and/or receive radio signals through one or more antennas 208. Each of the transceiver(s) 206 may include a transmitter and/or a receiver. The transceiver(s) 206 may be interchangeably used with RF unit(s). In the present disclosure, the wireless device may represent a communication modem/circuit/chip.

Hereinafter, hardware elements of the wireless devices 100 and 200 will be described more specifically. One or more protocol layers may be implemented by, without being limited to, one or more processors 102 and 202. For example, the one or more processors 102 and 202 may implement one or more layers (e.g., functional layers such as PHY, MAC, RLC, PDCP, RRC, and SDAP). The one or more processors 102 and 202 may generate one or more Protocol Data Units (PDUs) and/or one or more Service Data Unit (SDUs) according to the descriptions, functions, procedures, proposals, methods, and/or operational flowcharts disclosed in this document. The one or more processors 102 and 202 may generate messages, control information, data, or information according to the descriptions, functions, procedures, proposals, methods, and/or operational flowcharts disclosed in this document. The one or more processors 102 and 202 may generate signals (e.g., baseband signals) including PDUs, SDUs, messages, control information, data, or information according to the descriptions, functions, procedures, proposals, methods, and/or operational flowcharts disclosed in this document and provide the generated signals to the one or more transceivers 106 and 206. The one or more processors 102 and 202 may receive the signals (e.g., baseband signals) from the one or more transceivers 106 and 206 and acquire the PDUs, SDUs, messages, control information, data, or information according to the descriptions, functions, procedures, proposals, methods, and/or operational flowcharts disclosed in this document.

The one or more processors 102 and 202 may be referred to as controllers, microcontrollers, microprocessors, or microcomputers. The one or more processors 102 and 202 may be implemented by hardware, firmware, software, or a combination thereof. As an example, one or more Application Specific Integrated Circuits (ASICs), one or more Digital Signal Processors (DSPs), one or more Digital Signal Processing Devices (DSPDs), one or more Programmable Logic Devices (PLDs), or one or more Field Programmable Gate Arrays (FPGAs) may be included in the one or more processors 102 and 202. The descriptions, functions, procedures, proposals, methods, and/or operational flowcharts disclosed in this document may be implemented using firmware or software and the firmware or software may be configured to include the modules, procedures, or functions. Firmware or software configured to perform the descriptions, functions, procedures, proposals, methods, and/or operational flowcharts disclosed in this document may be included in the one or more processors 102 and 202 or stored in the one or more memories 104 and 204 so as to be driven by the one or more processors 102 and 202. The descriptions, functions, procedures, proposals, methods, and/or operational flowcharts disclosed in this document may be implemented using firmware or software in the form of code, commands, and/or a set of commands.

The one or more memories 104 and 204 may be connected to the one or more processors 102 and 202 and store various types of data, signals, messages, information, programs, code, instructions, and/or commands. The one or more memories 104 and 204 may be configured by Read-Only Memories (ROMs), Random Access Memories (RAMs), Electrically Erasable Programmable Read-Only Memories (EPROMs), flash memories, hard drives, registers, cash memories, computer-readable storage media, and/or combinations thereof. The one or more memories 104 and 204 may be located at the interior and/or exterior of the one or more processors 102 and 202. The one or more memories 104 and 204 may be connected to the one or more processors 102 and 202 through various technologies such as wired or wireless connection.

The one or more transceivers 106 and 206 may transmit user data, control information, and/or radio signals/channels, mentioned in the methods and/or operational flowcharts of this document, to one or more other devices. The one or more transceivers 106 and 206 may receive user data, control information, and/or radio signals/channels, mentioned in the descriptions, functions, procedures, proposals, methods, and/or operational flowcharts disclosed in this document, from one or more other devices. For example, the one or more transceivers 106 and 206 may be connected to the one or more processors 102 and 202 and transmit and receive radio signals. For example, the one or more processors 102 and 202 may perform control so that the one or more transceivers 106 and 206 may transmit user data, control information, or radio signals to one or more other devices. The one or more processors 102 and 202 may perform control so that the one or more transceivers 106 and 206 may receive user data, control information, or radio signals from one or more other devices. The one or more transceivers 106 and 206 may be connected to the one or more antennas 108 and 208 and the one or more transceivers 106 and 206 may be configured to transmit and receive user data, control information, and/or radio signals/channels, mentioned in the descriptions, functions, procedures, proposals, methods, and/or operational flowcharts disclosed in this document, through the one or more antennas 108 and 208. In this document, the one or more antennas may be a plurality of physical antennas or a plurality of logical antennas (e.g., antenna ports). The one or more transceivers 106 and 206 may convert received radio signals/channels etc. from RF band signals into baseband signals in order to process received user data, control information, radio signals/channels, etc. using the one or more processors 102 and 202. The one or more transceivers 106 and 206 may convert the user data, control information, radio signals/channels, etc. processed using the one or more processors 102 and 202 from the base band signals into the RF band signals. To this end, the one or more transceivers 106 and 206 may include (analog) oscillators and/or filters.

Figure 19:
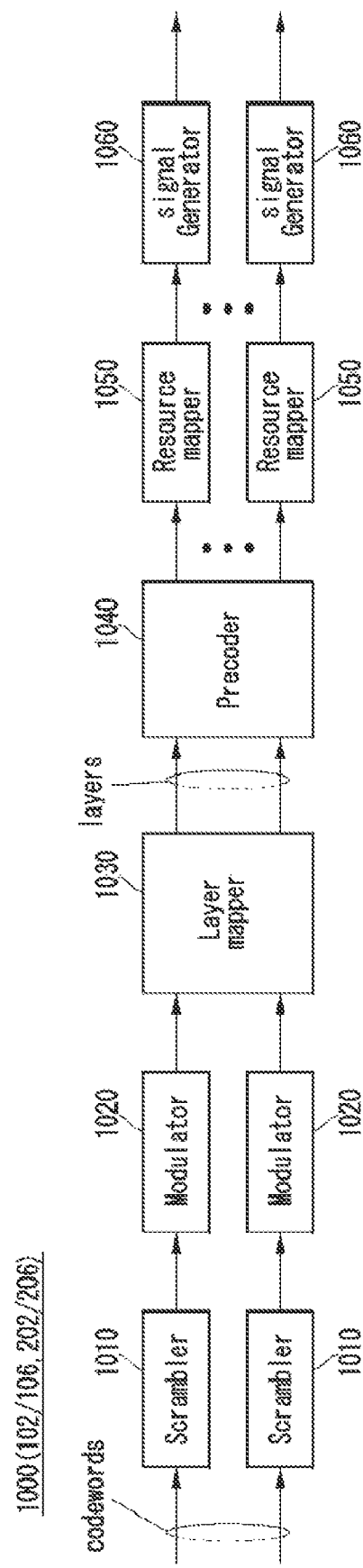
FIG. 19 illustrates a signal processing circuit for a transmission signal.

FIG. 19 illustrates a signal process circuit for a transmission signal.

Referring to FIG. 19, a signal processing circuit 1000 may include scramblers 1010, modulators 1020, a layer mapper 1030, a precoder 1040, resource mappers 1050, and signal generators 1060. An operation/function of FIG. 19 may be performed, without being limited to, the processors 102 and 202 and/or the transceivers 106 and 206 of FIG. 18. Hardware elements of FIG. 19 may be implemented by the processors 102 and 202 and/or the transceivers 106 and 206 of FIG. 18. For example, blocks 1010 to 1060 may be implemented by the processors 102 and 202 of FIG. 18. Alternatively, the blocks 1010 to 1050 may be implemented by the processors 102 and 202 of FIG. 18 and the block 1060 may be implemented by the transceivers 106 and 206 of FIG. 18.

Codewords may be converted into radio signals via the signal processing circuit 1000 of FIG. 19. Herein, the codewords are encoded bit sequences of information blocks. The information blocks may include transport blocks (e.g., a UL-SCH transport block, a DL-SCH transport block). The radio signals may be transmitted through various physical channels (e.g., a PUSCH and a PDSCH).

Specifically, the codewords may be converted into scrambled bit sequences by the scramblers 1010. Scramble sequences used for scrambling may be generated based on an initialization value, and the initialization value may include ID information of a wireless device. The scrambled bit sequences may be modulated to modulation symbol sequences by the modulators 1020. A modulation scheme may include pi/2-Binary Phase Shift Keying (pi/2-BPSK), m-Phase Shift Keying (m-PSK), and m-Quadrature Amplitude Modulation (m-QAM). Complex modulation symbol sequences may be mapped to one or more transport layers by the layer mapper 1030. Modulation symbols of each transport layer may be mapped (precoded) to corresponding antenna port(s) by the precoder 1040. Outputs z of the precoder 1040 may be obtained by multiplying outputs y of the layer mapper 1030 by an N*M precoding matrix W. Herein, N is the number of antenna ports and M is the number of transport layers. The precoder 1040 may perform precoding after performing transform precoding (e.g., DFT) for complex modulation symbols. Alternatively, the precoder 1040 may perform precoding without performing transform precoding.

The resource mappers 1050 may map modulation symbols of each antenna port to time-frequency resources. The time-frequency resources may include a plurality of symbols (e.g., a CP-OFDMA symbols and DFT-s-OFDMA symbols) in the time domain and a plurality of subcarriers in the frequency domain. The signal generators 1060 may generate radio signals from the mapped modulation symbols and the generated radio signals may be transmitted to other devices through each antenna. For this purpose, the signal generators 1060 may include Inverse Fast Fourier Transform (IFFT) modules, Cyclic Prefix (CP) inserters, Digital-to-Analog Converters (DACs), and frequency up-converters.

Signal processing procedures for a signal received in the wireless device may be configured in a reverse manner of the signal processing procedures 1010 to 1060 of FIG. 19. For example, the wireless devices (e.g., 100 and 200 of FIG. 18) may receive radio signals from the exterior through the antenna ports/transceivers. The received radio signals may be converted into baseband signals through signal restorers. To this end, the signal restorers may include frequency downlink converters, Analog-to-Digital Converters (ADCs), CP remover, and Fast Fourier Transform (FFT) modules. Next, the baseband signals may be restored to codewords through a resource demapping procedure, a postcoding procedure, a demodulation processor, and a descrambling procedure. The codewords may be restored to original information blocks through decoding. Therefore, a signal processing circuit (not illustrated) for a reception signal may include signal restorers, resource demappers, a postcoder, demodulators, descramblers, and decoders.

Figure 20:
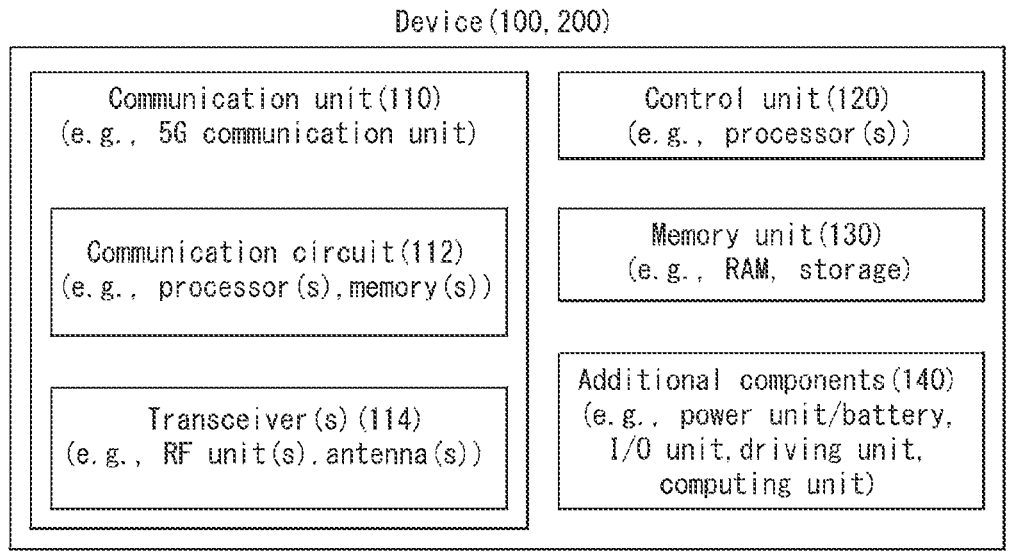
FIG. 20 shows another example of a wireless device applied to the present disclosure.

FIG. 20 illustrates another example of a wireless device applied to the present disclosure. The wireless device may be implemented in various forms according to a use-case/service (refer to FIG. 17 and FIGS. 21 to X9).

Referring to FIG. 20, wireless devices 100 and 200 may correspond to the wireless devices 100 and 200 of FIG. 18 and may be configured by various elements, components, units/portions, and/or modules. For example, each of the wireless devices 100 and 200 may include a communication unit 110, a control unit 120, a memory unit 130, and additional components 140. The communication unit may include a communication circuit 112 and transceiver(s) 114. For example, the communication circuit 112 may include the one or more processors 102 and 202 and/or the one or more memories 104 and 204 of FIG. 18. For example, the transceiver(s) 114 may include the one or more transceivers 106 and 206 and/or the one or more antennas 108 and 208 of FIG. 18. The control unit 120 is electrically connected to the communication unit 110, the memory 130, and the additional components 140 and controls overall operation of the wireless devices. For example, the control unit 120 may control an electric/mechanical operation of the wireless device based on programs/code/commands/information stored in the memory unit 130. The control unit 120 may transmit the information stored in the memory unit 130 to the exterior (e.g., other communication devices) via the communication unit 110 through a wireless/wired interface or store, in the memory unit 130, information received through the wireless/wired interface from the exterior (e.g., other communication devices) via the communication unit 110.

The additional components 140 may be variously configured according to types of wireless devices. For example, the additional components 140 may include at least one of a power unit/battery, input/output (I/O) unit, a driving unit, and a computing unit. The wireless device may be implemented in the form of, without being limited to, the robot (100a of FIG. 17), the vehicles (100b-1 and 100b-2 of FIG. 17), the XR device (100c of FIG. 17), the hand-held device (100d of FIG. 17), the home appliance (100e of FIG. 17), the IoT device (100f of FIG. 17), a digital broadcast terminal, a hologram device, a public safety device, an MTC device, a medicine device, a fintech device (or a finance device), a security device, a climate/environment device, the AI server/device (400 of FIG. 17), the BSs (200 of FIG. 17), a network node, etc. The wireless device may be used in a mobile or fixed place according to a use-example/service.

In FIG. 20, the entirety of the various elements, components, units/portions, and/or modules in the wireless devices 100 and 200 may be connected to each other through a wired interface or at least a part thereof may be wirelessly connected through the communication unit 110. For example, in each of the wireless devices 100 and 200, the control unit 120 and the communication unit 110 may be connected by wire and the control unit 120 and first units (e.g., 130 and 140) may be wirelessly connected through the communication unit 110. Each element, component, unit/portion, and/or module within the wireless devices 100 and 200 may further include one or more elements. For example, the control unit 120 may be configured by a set of one or more processors. As an example, the control unit 120 may be configured by a set of a communication control processor, an application processor, an Electronic Control Unit (ECU), a graphical processing unit, and a memory control processor. As another example, the memory 130 may be configured by a Random Access Memory (RAM), a Dynamic RAM (DRAM), a Read Only Memory (ROM), a flash memory, a volatile memory, a non-volatile memory, and/or a combination thereof.

Hereinafter, an example of implementing FIG. 20 will be described in detail with reference to the drawings.

Figure 21:
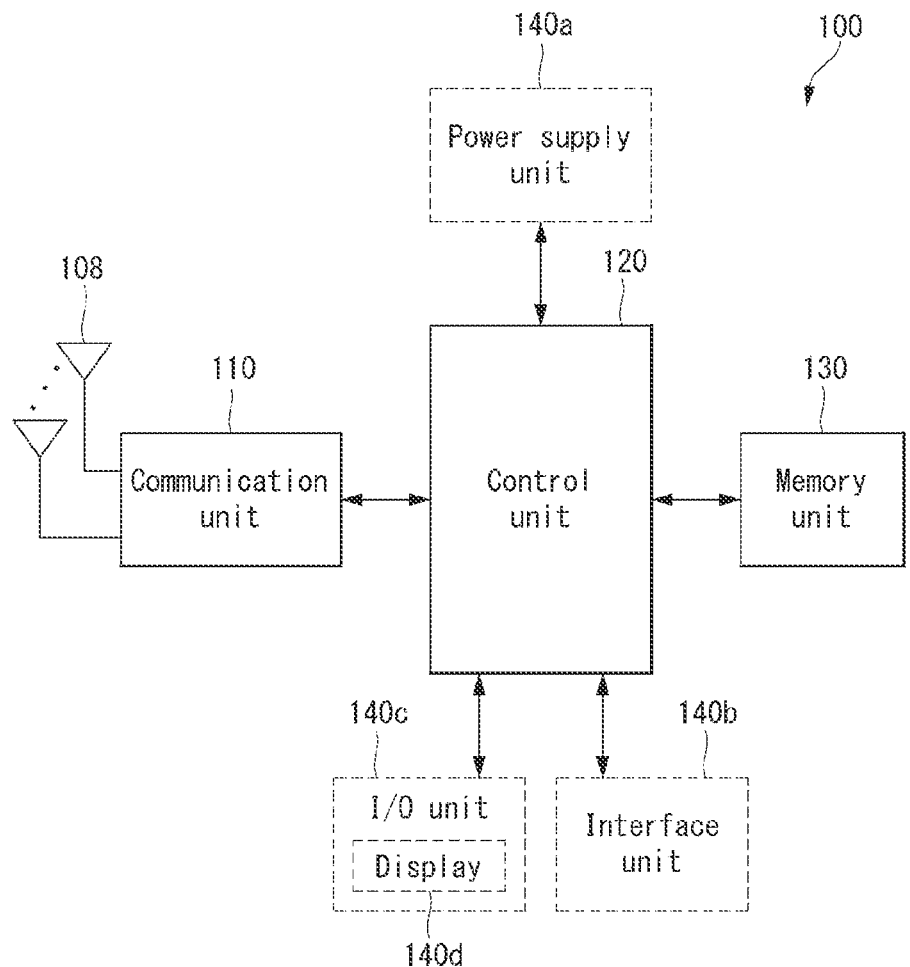
FIG. 21 illustrates a portable device applied to the present disclosure.

FIG. 21 illustrates a hand-held device applied to the present disclosure. The hand-held device may include a smartphone, a smartpad, a wearable device (e.g., a smartwatch or a smartglasses), or a portable computer (e.g., a notebook). The hand-held device may be referred to as a mobile station (MS), a user terminal (UT), a Mobile Subscriber Station (MSS), a Subscriber Station (SS), an Advanced Mobile Station (AMS), or a Wireless Terminal (WT).

Referring to FIG. 21, a hand-held device 100 may include an antenna unit 108, a communication unit 110, a control unit 120, a memory unit 130, a power supply unit 140a, an interface unit 140b, and an I/O unit 140c. The antenna unit 108 may be configured as a part of the communication unit 110. Blocks 110 to 130/140a to 140c correspond to the blocks 110 to 130/140 of FIG. 20, respectively.

The communication unit 110 may transmit and receive signals (e.g., data and control signals) to and from other wireless devices or BSs. The control unit 120 may perform various operations by controlling constituent elements of the hand-held device 100. The control unit 120 may include an Application Processor (AP). The memory unit 130 may store data/parameters/programs/code/commands needed to drive the hand-held device 100. The memory unit 130 may store input/output data/information. The power supply unit 140a may supply power to the hand-held device 100 and include a wired/wireless charging circuit, a battery, etc. The interface unit 140b may support connection of the hand-held device 100 to other external devices. The interface unit 140b may include various ports (e.g., an audio I/O port and a video I/O port) for connection with external devices. The I/O unit 140c may input or output video information/signals, audio information/signals, data, and/or information input by a user. The I/O unit 140c may include a camera, a microphone, a user input unit, a display unit 140d, a speaker, and/or a haptic module.

As an example, in the case of data communication, the I/O unit 140c may acquire information/signals (e.g., touch, text, voice, images, or video) input by a user and the acquired information/signals may be stored in the memory unit 130. The communication unit 110 may convert the information/signals stored in the memory into radio signals and transmit the converted radio signals to other wireless devices directly or to a BS. The communication unit 110 may receive radio signals from other wireless devices or the BS and then restore the received radio signals into original information/signals. The restored information/signals may be stored in the memory unit 130 and may be output as various types (e.g., text, voice, images, video, or haptic) through the I/O unit 140c.

Figure 22:
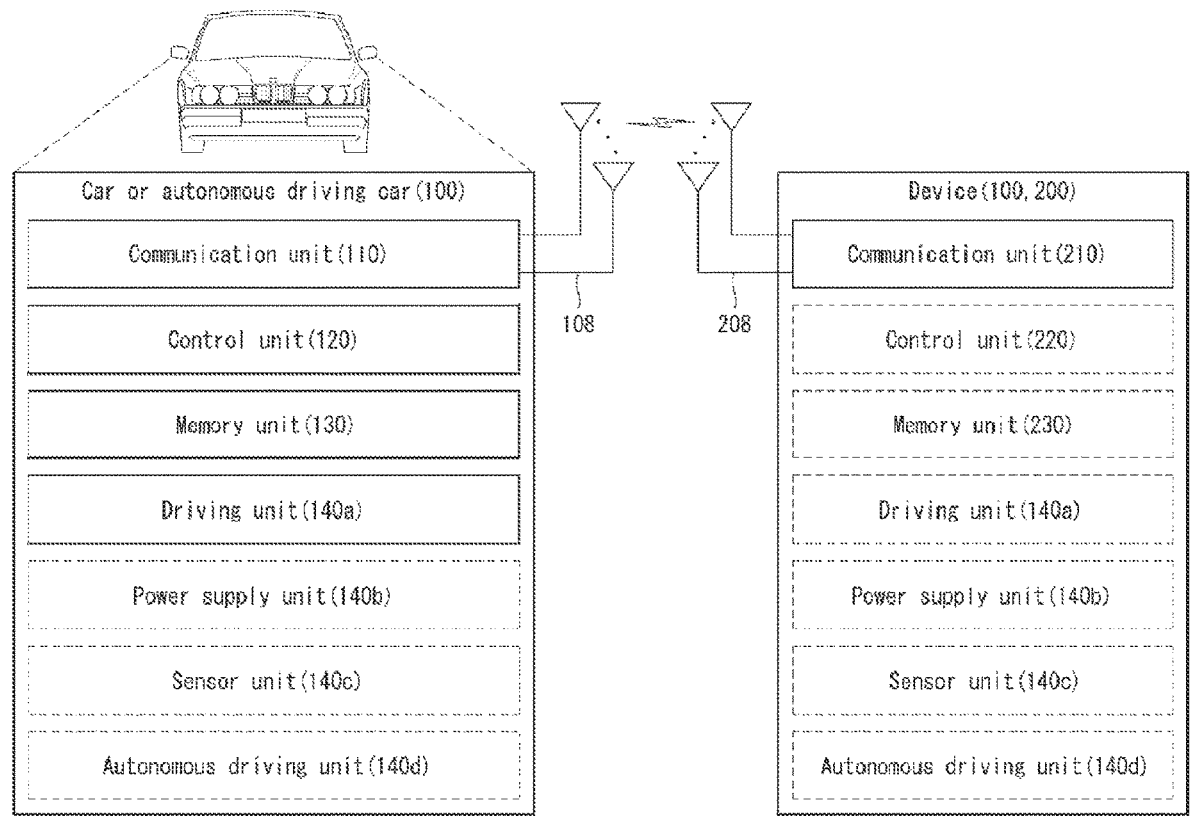
FIG. 22 illustrates a vehicle or an autonomous vehicle to which the present disclosure is applied.

FIG. 22 illustrates a vehicle or an autonomous driving vehicle applied to the present disclosure. The vehicle or autonomous driving vehicle may be implemented by a mobile robot, a car, a train, a manned/unmanned Aerial Vehicle (AV), a ship, etc.

Referring to FIG. 22, a vehicle or autonomous driving vehicle 100 may include an antenna unit 108, a communication unit 110, a control unit 120, a driving unit 140a, a power supply unit 140b, a sensor unit 140c, and an autonomous driving unit 140d. The antenna unit 108 may be configured as a part of the communication unit 110. The blocks 110/130/140a to 140d correspond to the blocks 110/130/140 of FIG. 20, respectively.

The communication unit 110 may transmit and receive signals (e.g., data and control signals) to and from external devices such as other vehicles, BSs (e.g., gNBs and road side units), and servers. The control unit 120 may perform various operations by controlling elements of the vehicle or the autonomous driving vehicle 100. The control unit 120 may include an Electronic Control Unit (ECU). The driving unit 140a may cause the vehicle or the autonomous driving vehicle 100 to drive on a road. The driving unit 140a may include an engine, a motor, a powertrain, a wheel, a brake, a steering device, etc. The power supply unit 140b may supply power to the vehicle or the autonomous driving vehicle 100 and include a wired/wireless charging circuit, a battery, etc. The sensor unit 140c may acquire a vehicle state, ambient environment information, user information, etc. The sensor unit 140c may include an Inertial Measurement Unit (IMU) sensor, a collision sensor, a wheel sensor, a speed sensor, a slope sensor, a weight sensor, a heading sensor, a position module, a vehicle forward/backward sensor, a battery sensor, a fuel sensor, a tire sensor, a steering sensor, a temperature sensor, a humidity sensor, an ultrasonic sensor, an illumination sensor, a pedal position sensor, etc. The autonomous driving unit 140d may implement technology for maintaining a lane on which a vehicle is driving, technology for automatically adjusting speed, such as adaptive cruise control, technology for autonomously driving along a determined path, technology for driving by automatically setting a path if a destination is set, and the like.

For example, the communication unit 110 may receive map data, traffic information data, etc. from an external server. The autonomous driving unit 140d may generate an autonomous driving path and a driving plan from the obtained data. The control unit 120 may control the driving unit 140a such that the vehicle or the autonomous driving vehicle 100 may move along the autonomous driving path according to the driving plan (e.g., speed/direction control). In the middle of autonomous driving, the communication unit 110 may aperiodically/periodically acquire recent traffic information data from the external server and acquire surrounding traffic information data from neighboring vehicles. In the middle of autonomous driving, the sensor unit 140c may obtain a vehicle state and/or surrounding environment information. The autonomous driving unit 140d may update the autonomous driving path and the driving plan based on the newly obtained data/information. The communication unit 110 may transfer information about a vehicle position, the autonomous driving path, and/or the driving plan to the external server. The external server may predict traffic information data using AI technology, etc., based on the information collected from vehicles or autonomous driving vehicles and provide the predicted traffic information data to the vehicles or the autonomous driving vehicles.

Figure 23:
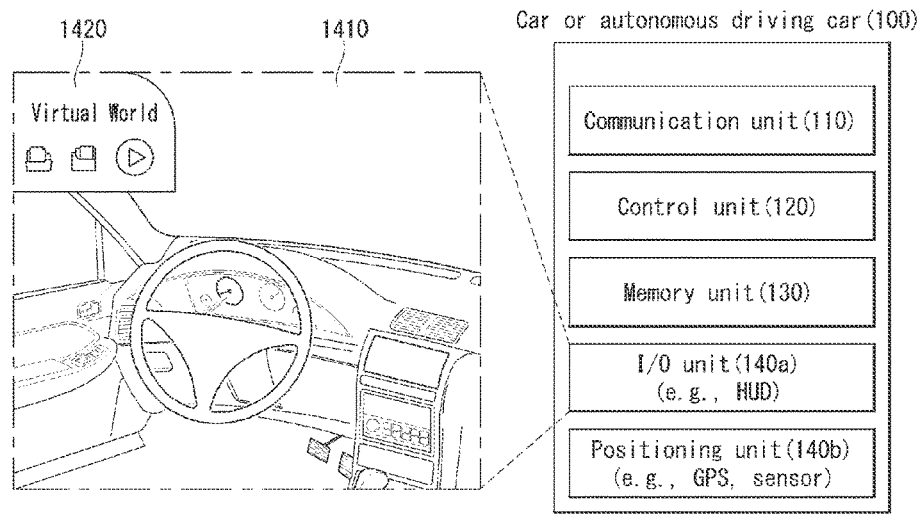
FIG. 23 illustrates a vehicle applied to the present disclosure.

FIG. 23 illustrates a vehicle applied to the present disclosure. The vehicle may be implemented as a transport means, an aerial vehicle, a ship, etc.

Referring to FIG. 23, a vehicle 100 may include a communication unit 110, a control unit 120, a memory unit 130, an I/O unit 140a, and a positioning unit 140b. Herein, the blocks 110 to 130/140a and 140b correspond to blocks 110 to 130/140 of FIG. 20.

The communication unit 110 may transmit and receive signals (e.g., data and control signals) to and from external devices such as other vehicles or BSs. The control unit 120 may perform various operations by controlling constituent elements of the vehicle 100. The memory unit 130 may store data/parameters/programs/code/commands for supporting various functions of the vehicle 100. The I/O unit 140a may output an AR/VR object based on information within the memory unit 130. The I/O unit 140a may include an HUD. The positioning unit 140b may acquire information about the position of the vehicle 100. The position information may include information about an absolute position of the vehicle 100, information about the position of the vehicle 100 within a traveling lane, acceleration information, and information about the position of the vehicle 100 from a neighboring vehicle. The positioning unit 140b may include a GPS and various sensors.

As an example, the communication unit 110 of the vehicle 100 may receive map information and traffic information from an external server and store the received information in the memory unit 130. The positioning unit 140b may obtain the vehicle position information through the GPS and various sensors and store the obtained information in the memory unit 130. The control unit 120 may generate a virtual object based on the map information, traffic information, and vehicle position information and the I/O unit 140a may display the generated virtual object in a window in the vehicle (1410 and 1420). The control unit 120 may determine whether the vehicle 100 normally drives within a traveling lane, based on the vehicle position information. If the vehicle 100 abnormally exits from the traveling lane, the control unit 120 may display a warning on the window in the vehicle through the I/O unit 140a. In addition, the control unit 120 may broadcast a warning message regarding driving abnormity to neighboring vehicles through the communication unit 110. According to situation, the control unit 120 may transmit the vehicle position information and the information about driving/vehicle abnormality to related organizations.

Figure 24:
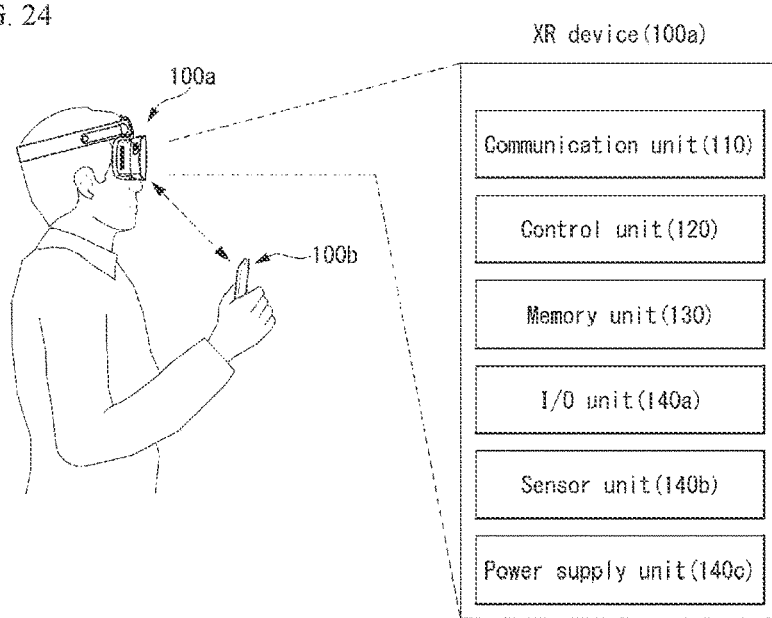
FIG. 24 illustrates an XR device applied to the present disclosure.

FIG. 24 illustrates an XR device applied to the present disclosure. The XR device may be implemented by an HMD, an HUD mounted in a vehicle, a television, a smartphone, a computer, a wearable device, a home appliance, a digital signage, a vehicle, a robot, etc.

Referring to FIG. 24, an XR device 100a may include a communication unit 110, a control unit 120, a memory unit 130, an I/O unit 140a, a sensor unit 140b, and a power supply unit 140c. Herein, the blocks 110 to 130/140a to 140c correspond to the blocks 110 to 130/140 of FIG. 20, respectively.

The communication unit 110 may transmit and receive signals (e.g., media data and control signals) to and from external devices such as other wireless devices, hand-held devices, or media servers. The media data may include video, images, and sound. The control unit 120 may perform various operations by controlling constituent elements of the XR device 100a. For example, the control unit 120 may be configured to control and/or perform procedures such as video/image acquisition, (video/image) encoding, and metadata generation and processing. The memory unit 130 may store data/parameters/programs/code/commands needed to drive the XR device 100a/generate XR object. The I/O unit 140a may obtain control information and data from the exterior and output the generated XR object. The I/O unit 140a may include a camera, a microphone, a user input unit, a display unit, a speaker, and/or a haptic module. The sensor unit 140b may obtain an XR device state, surrounding environment information, user information, etc. The sensor unit 140b may include a proximity sensor, an illumination sensor, an acceleration sensor, a magnetic sensor, a gyro sensor, an inertial sensor, an RGB sensor, an IR sensor, a fingerprint recognition sensor, an ultrasonic sensor, a light sensor, a microphone and/or a radar. The power supply unit 140c may supply power to the XR device 100a and include a wired/wireless charging circuit, a battery, etc.

For example, the memory unit 130 of the XR device 100a may include information (e.g., data) needed to generate the XR object (e.g., an AR/VR/MR object). The I/O unit 140a may receive a command for manipulating the XR device 100a from a user and the control unit 120 may drive the XR device 100a according to a driving command of a user. For example, when a user desires to watch a film or news through the XR device 100a, the control unit 120 transmits content request information to another device (e.g., a hand-held device 100b) or a media server through the communication unit 130. The communication unit 130 may download/stream content such as films or news from another device (e.g., the hand-held device 100b) or the media server to the memory unit 130. The control unit 120 may control and/or perform procedures such as video/image acquisition, (video/image) encoding, and metadata generation/processing with respect to the content and generate/output the XR object based on information about a surrounding space or a real object obtained through the I/O unit 140a/sensor unit 140b.

The XR device 100a may be wirelessly connected to the hand-held device 100b through the communication unit 110 and the operation of the XR device 100*a* may be controlled by the hand-held device 100*b*. For example, the hand-held device 100*b* may operate as a controller of the XR device 100*a*. To this end, the XR device 100*a* may obtain information about a 3D position of the hand-held device 100*b* and generate and output an XR object corresponding to the hand-held device 100*b*.

Figure 25:
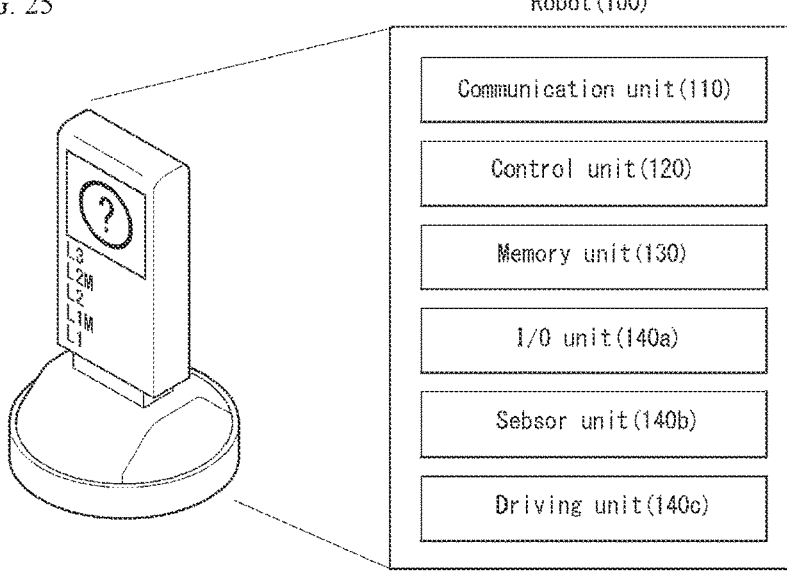
FIG. 25 illustrates a robot applied to the present disclosure.
Figure 26:
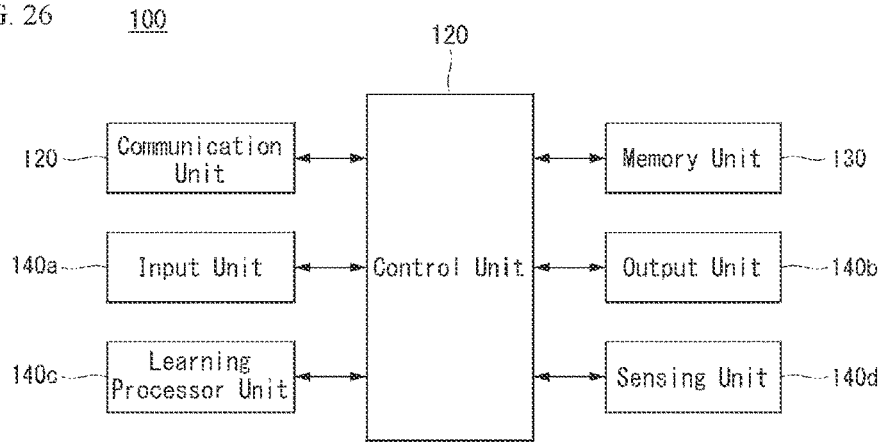
FIG. 26 illustrates an AI device applied to the present disclosure.

FIG. 25 illustrates a robot applied to the present disclosure. The robot may be categorized into an industrial robot, a medical robot, a household robot, a military robot, etc., according to a used purpose or field.

Referring to FIG. 25, a robot 100 may include a communication unit 110, a control unit 120, a memory unit 130, an I/O unit 140*a*, a sensor unit 140*b*, and a driving unit 140*c*. Herein, the blocks 110 to 130/140*a* to 140*c* correspond to the blocks 110 to 130/140 of FIG. 20, respectively.

The communication unit 110 may transmit and receive signals (e.g., driving information and control signals) to and from external devices such as other wireless devices, other robots, or control servers. The control unit 120 may perform various operations by controlling constituent elements of the robot 100. The memory unit 130 may store data/parameters/programs/code/commands for supporting various functions of the robot 100. The I/O unit 140*a* may obtain information from the exterior of the robot 100 and output information to the exterior of the robot 100. The I/O unit 140*a* may include a camera, a microphone, a user input unit, a display unit, a speaker, and/or a haptic module. The sensor unit 140*b* may obtain internal information of the robot 100, surrounding environment information, user information, etc. The sensor unit 140*b* may include a proximity sensor, an illumination sensor, an acceleration sensor, a magnetic sensor, a gyro sensor, an inertial sensor, an IR sensor, a fingerprint recognition sensor, an ultrasonic sensor, a light sensor, a microphone, a radar, etc. The driving unit 140*c* may perform various physical operations such as movement of robot joints. In addition, the driving unit 140*c* may cause the robot 100 to travel on the road or to fly. The driving unit 140*c* may include an actuator, a motor, a wheel, a brake, a propeller, etc.

FIG. X9 illustrates an AI device applied to the present disclosure. The AI device may be implemented by a fixed device or a mobile device, such as a TV, a projector, a smartphone, a PC, a notebook, a digital broadcast terminal, a tablet PC, a wearable device, a Set Top Box (STB), a radio, a washing machine, a refrigerator, a digital signage, a robot, a vehicle, etc.

Referring to FIG. X9, an AI device 100 may include a communication unit 110, a control unit 120, a memory unit 130, an I/O unit 140*a*/140*b*, a learning processor unit 140*c*, and a sensor unit 140*d*. The blocks 110 to 130/140*a* to 140*d* correspond to blocks 110 to 130/140 of FIG. 20, respectively.

The communication unit 110 may transmit and receive wired/radio signals (e.g., sensor information, user input, learning models, or control signals) to and from external devices such as other AI devices (e.g., 100*x*, 200, or 400 of FIG. 17) or an AI server (e.g., 400 of FIG. 17) using wired/wireless communication technology. To this end, the communication unit 110 may transmit information within the memory unit 130 to an external device and transmit a signal received from the external device to the memory unit 130.

The control unit 120 may determine at least one feasible operation of the AI device 100, based on information which is determined or generated using a data analysis algorithm or a machine learning algorithm. The control unit 120 may perform an operation determined by controlling constituent elements of the AI device 100. For example, the control unit 120 may request, search, receive, or use data of the learning processor unit 140*c* or the memory unit 130 and control the constituent elements of the AI device 100 to perform a predicted operation or an operation determined to be preferred among at least one feasible operation. The control unit 120 may collect history information including the operation contents of the AI device 100 and operation feedback by a user and store the collected information in the memory unit 130 or the learning processor unit 140*c* or transmit the collected information to an external device such as an AI server (400 of FIG. 17). The collected history information may be used to update a learning model.

The memory unit 130 may store data for supporting various functions of the AI device 100. For example, the memory unit 130 may store data obtained from the input unit 140*a*, data obtained from the communication unit 110, output data of the learning processor unit 140*c*, and data obtained from the sensor unit 140. The memory unit 130 may store control information and/or software code needed to operate/drive the control unit 120.

The input unit 140*a* may acquire various types of data from the exterior of the AI device 100. For example, the input unit 140*a* may acquire learning data for model learning, and input data to which the learning model is to be applied. The input unit 140*a* may include a camera, a microphone, and/or a user input unit. The output unit 140*b* may generate output related to a visual, auditory, or tactile sense. The output unit 140*b* may include a display unit, a speaker, and/or a haptic module. The sensing unit 140 may obtain at least one of internal information of the AI device 100, surrounding environment information of the AI device 100, and user information, using various sensors. The sensor unit 140 may include a proximity sensor, an illumination sensor, an acceleration sensor, a magnetic sensor, a gyro sensor, an inertial sensor, an RGB sensor, an IR sensor, a fingerprint recognition sensor, an ultrasonic sensor, a light sensor, a microphone, and/or a radar.

The learning processor unit 140*c* may learn a model consisting of artificial neural networks, using learning data. The learning processor unit 140*c* may perform AI processing together with the learning processor unit of the AI server (400 of FIG. 17). The learning processor unit 140*c* may process information received from an external device through the communication unit 110 and/or information stored in the memory unit 130. In addition, an output value of the learning processor unit 140*c* may be transmitted to the external device through the communication unit 110 and may be stored in the memory unit 130.

Here, the wireless communication technology implemented in the wireless device (100, 200) of the present disclosure may include LTE, NR, and 6G as well as Narrowband Internet of Things for low power communication. At this time, for example, NB-IoT technology may be an example of LPWAN (Low Power Wide Area Network) technology, and may be implemented in standards such as LTE Cat NB1 and/or LTE Cat NB2. not. Additionally or alternatively, the wireless communication technology implemented in the wireless device (100, 200) of the present disclosure may perform communication based on LTE-M technology. At this time, as an example, LTE-M technology may be an example of LPWAN technology, and may be called various names such as eMTC (enhanced machine type communication). For example, LTE-M technologies are 1) LTE CAT 0, 2) LTE Cat M1, 3) LTE Cat M2, 4) LTE non-BL (non-Bandwidth Limited), 5) LTE-MTC, 6) LTE Machine Type Communication, and/or 7) It may be implemented in at least one of various standards such as LTE M, and is not limited to the above-mentioned names. Additionally or alternatively, the wireless communication technology implemented in the wireless device (100, 200) of the present disclosure is at least one of ZigBee, Bluetooth, and Low Power Wide Area Network (LPWAN) considering low power communication It may include any one, and is not limited to the above-mentioned names. For example, ZigBee technology can generate personal area networks (PANs) related to small/low-power digital communication based on various standards such as IEEE 802.15.4, and can be called various names.

Accordingly, the above detailed description should not be construed as limiting in all respects and should be considered illustrative. The scope of this disclosure should be determined by reasonable interpretation of the appended claims, and all changes within the equivalent scope of this disclosure are included in the scope of this disclosure.

The invention claimed is:

1. A digital conversion device of a wireless signal, comprising:
   a plurality of antennas for receiving a reception signal of a predetermined range of reception voltage level;
   a plurality of unit analog to digital converter (ADC) portions one-to-one matched to the antennas and for converting a partial voltage level within the range of the reception voltage level of the reception signal to binary data, wherein the plurality of unit ADC portions converts each of the partial voltage level having different voltage level to binary data; and
   an encoder for generating a digital code that a voltage level corresponding to the reception voltage level is converted to binary data based on the binary data output from the unit ADC portions.

2. The digital conversion device of a wireless signal of claim 1, wherein each of the unit ADC portions includes:
   a plurality of RF signal processors for adjusting the voltage level of the reception signal based on an automatic gain value; and
   a plurality of unit ADCs for receiving an input of an in-phase signal and a quadrature-phase signal of each of the RF signal processors, wherein each of the plurality of unit ADCs performs an analogue to digital conversion based on a differential reference voltage.

3. The digital conversion device of a wireless signal of claim 2, wherein the encoder generates binary data of a bit lower than a bit of the binary data based on the binary data output from the unit ADCs.

4. The digital conversion device of a wireless signal of claim 3, further comprising an automatic gain controller for generating the automatic gain value based on an output of a spatial ADC.

5. The digital conversion device of a wireless signal of claim 3, wherein the encoder includes:
   a plurality of unit encoders for generating a thermometer code from respective binary data output from the unit ADCs; and
   a spatial encoder for generating binary data of a smaller bit based on the binary data output from each of the unit encoders.

6. The digital conversion device of a wireless signal of claim 5, wherein each of the unit encoders outputs data of 1-bit.

7. The digital conversion device of a wireless signal of claim 6,
   wherein the encoder includes m unit encoders, and
   wherein the encoder generates binary data of n-bit (n is a natural number smaller than m) based on m binary data (m is a natural number) output from the unit encoders, and the binary data of n-bit is generated to be proportional to a value of "1" among the m binary data.

8. The digital conversion device of a wireless signal of claim 7, wherein the number of unit encoders is set to "$2^n-1$".

9. The digital conversion device of a wireless signal of claim 7, wherein the differential reference voltage input to each of the m spatial encoders is proportional by an integer multiple with each other.

10. The digital conversion device of a wireless signal of claim 4, wherein each of the RF signal processors is provided with the automatic gain value of a same size.

11. The digital conversion device of a wireless signal of claim 10, wherein the automatic gain value includes:
    a first automatic gain value input to a low noise amplifier and a second automatic gain value input to a variable gain adjuster.

12. The digital conversion device of a wireless signal of claim 11, wherein the first automatic gain value is adjusted such that a different of output signal levels among the low noise amplifiers is less than a preconfigured threshold value.

13. The digital conversion device of a wireless signal of claim 11, wherein the automatic gain controller controls the first and second automatic gain values to deactivate the RF signal processor to which the reception antenna is belonged, based on the voltage level of a signal received through an arbitrary antenna being a preconfigured threshold voltage or lower.

14. The digital conversion device of a wireless signal of claim 4, wherein the automatic gain controller generates the automatic gain value based on outputs of unit encoders or spatial encoders.

15. The digital conversion device of a wireless signal of claim 14, wherein the automatic gain controller calculates an instantaneous power based on a square of the in-phase signal and a square of the quadrature-phase signal and calculates the automatic gain value based on a hysteresis of the difference value between the instantaneous power and a target power value.

16. The digital conversion device of a wireless signal of claim 1, wherein each of the spatial ADCs operates by using a common clock.

17. The digital conversion device of a wireless signal of claim 1, wherein a phase of the reception signal is arranged with respect to an input signal of the unit ADC.

18. The digital conversion device of a wireless signal of claim 1, wherein each of the spatial ADCs digital-converts the partial voltage level on a different timing.

* * * * *